United States Patent

Ranjan

[11] Patent Number: 5,862,390
[45] Date of Patent: Jan. 19, 1999

[54] MIXED VOLTAGE, MULTI-RAIL, HIGH DRIVE, LOW NOISE, ADJUSTABLE SLEW RATE INPUT/OUTPUT BUFFER

[75] Inventor: Nalini Ranjan, Sunnyvale, Calif.

[73] Assignee: S3 Incorporated, Santa Clara, Calif.

[21] Appl. No.: 616,835

[22] Filed: Mar. 15, 1996

[51] Int. Cl.[6] .......................... G06K 1/26; H03K 19/0175
[52] U.S. Cl. ...................... 395/750.01; 395/872; 326/80; 326/87
[58] Field of Search ..................... 395/750, 872, 395/750.01; 326/26, 27, 68, 83, 85, 87, 80; 370/402; 361/56, 57

[56] References Cited

U.S. PATENT DOCUMENTS

| | | | |
|---|---|---|---|
| 4,789,796 | 12/1988 | Foss | 326/27 |
| 5,122,690 | 6/1992 | Bianchi | 326/87 |
| 5,270,589 | 12/1993 | Sawada et al. | 307/475 |
| 5,300,835 | 4/1994 | Assar et al. | 307/475 |
| 5,347,150 | 9/1994 | Sakai et al. | 259/203 |
| 5,418,476 | 5/1995 | Strauss | 326/58 |
| 5,422,523 | 6/1995 | Roberts et al. | 326/68 |
| 5,424,653 | 6/1995 | Folmsbee et al. | 326/26 |
| 5,426,376 | 6/1995 | Wong et al. | 326/27 |
| 5,519,338 | 5/1996 | Campbell et al. | 326/27 |
| 5,534,791 | 7/1996 | Mattos et al. | 326/27 |

*Primary Examiner*—Gopal C. Ray
*Attorney, Agent, or Firm*—Skjeven, Morrill, MacPherson, Franklin & Friel LLP; Norman R. Klivans

[57] ABSTRACT

A universal input/output buffer uses all digital-type components, can be included on an integrated circuit chip and operates in a mixed voltage, multi-rail, power supply environment. The input/output buffer includes a multi-stage driver section and a sequencing section. Several types of sequencing techniques are used to control a plurality of driver stages and provide a combination of multiple firing schemes. In addition, other control techniques are employed such as full and partial feedback, sequential turn on/turn off of driver stages, and controlled introduction of a small amount of "crow bar" current.

5 Claims, 20 Drawing Sheets

MIXED VOLTAGE, MULTI-RAIL, HIGH DRIVE, LOW NOISE, ADJUSTABLE SLEW RATE INPUT/OUTPUT BUFFER

BACKGROUND OF THE INVENTION

1. Field of the Invention

This invention relates to electronic signal processing and in particular to a digital input/output buffer used to buffer signals to and from logic implemented in an integrated circuit chip and an external interface system and for a mixed voltage, multi-rail, power supply environment.

2. Related Art

It is well known in the art of electronic signal processing that an input/output (IO) buffer is required when signals are transferred from logic included on an integrated circuit chip, or other electronic device, to an interface system external to the chip or electronic device. Prior art input/output buffers typically include pull-up and pull-down transistors driven by NAND and NOR gates respectively, where both the NAND and NOR gates are driven by an output enable signal and an input signal (i.e. the signal to be transferred). Furthermore, at times more than one pull-up and pull-down transistor has been used in parallel with or without an RC delay network. RC delay is provided by a series of capacitors and resistors configured in RC delay networks; the resistances and capacitances can either be lumped or layout parasitics. Such prior art buffers serving as delay elements hence use analog devices, as opposed to the digital devices generally employed by the integrated circuit chip logic and external interface systems. This limitation increases system cost and complicates fabrication With multiple pull-up/pull-down transistors, this type of design does not address the issue of multi-stage firing control, sequencing of the transistor firing, noise and short circuit current (also known as shoot through current or crowbar current). (The process of turning a transistor on is also referred to as "firing" the transistor.)

In addition, it is often desirable to use one supply voltage to operate the logic included on the integrated circuit chip and a different supply voltage for the external interface system. Consequently, it is desirable to have an input/output buffer capable of handling two different supply voltages and which can translate logic signals operating at the first supply voltage to the second supply voltage. For instance, two voltages commonly used art are 3.3 volts, which is generally considered a low noise voltage, and 5.0 volts, which is generally considered to be a noisy voltage supply. Both 3.3 volt and 5.0 volt power supplies typically include a margin of error of ±10%.

What is needed is an input/output buffer which uses all digital components (i.e., no resistors or capacitors) and can easily be included on the integrated circuit chip or the external interface system. "Digital components" refers here to transistors. Ideally the input/output buffer operates in a mixed voltage, multi-rail, power supply environment and provides minimal introduction of noise into the data signal. The input/output buffer should also be compatible with the PCI and VL bus electrical characteristics.

SUMMARY

According to the invention a universal input/output (IO) buffer uses digital components, can be included on an integrated circuit chip, and operates in a mixed voltage, multi-rail, power supply environment. This input/output buffer is also adjustable along the optimum noise/speed curve of an ideal buffer.

The present input/output buffer includes a multi-stage driver section and a sequencing section which controls noise speed and short circuit currents in order to ensure operation of the buffer at the optimum point on the performance/noise curve. Several types of sequencing techniques have been developed according to the invention to control the driver stages and provide a combination of multiple firing schemes. In addition, other control techniques are employed such as full and partial feedback, sequential turn on/turn off, and controlled introduction of a small amount of "crow bar" current.

Some embodiments of an input/output buffer in accordance with the invention include the following features and advantages:

1. Compatibility with the PCI and VL bus electrical characteristics.
2. Capability to buffer input signals from low and high voltage gates.
3. Compatibility with both low and high supply voltages such as the commonly used 3.3 volt and 5.0 volt supply voltages.
4. A unique power supply/ground configuration for noise reduction.
5. A unique level translator scheme for translating logic signals between two voltage levels.
6. A multi-stage firing capability with delay control.
7. A multi-stage firing capability with unique turn on and turn off sequencing.
8. A multi-stage firing capability with different pre-determined signals for the firing stages.
9. Capability to provide the controlled introduction of crow bar current for noise reduction.
10. A full or partial feed-back capability for minimizing crow bar current.
11. Programmable drive combinations.

In addition, by making small changes in the sequencing section of the present basic input/output buffer, a circuit designer can modify it to meet specific needs.

DETAILED DESCRIPTION

Figure 1:
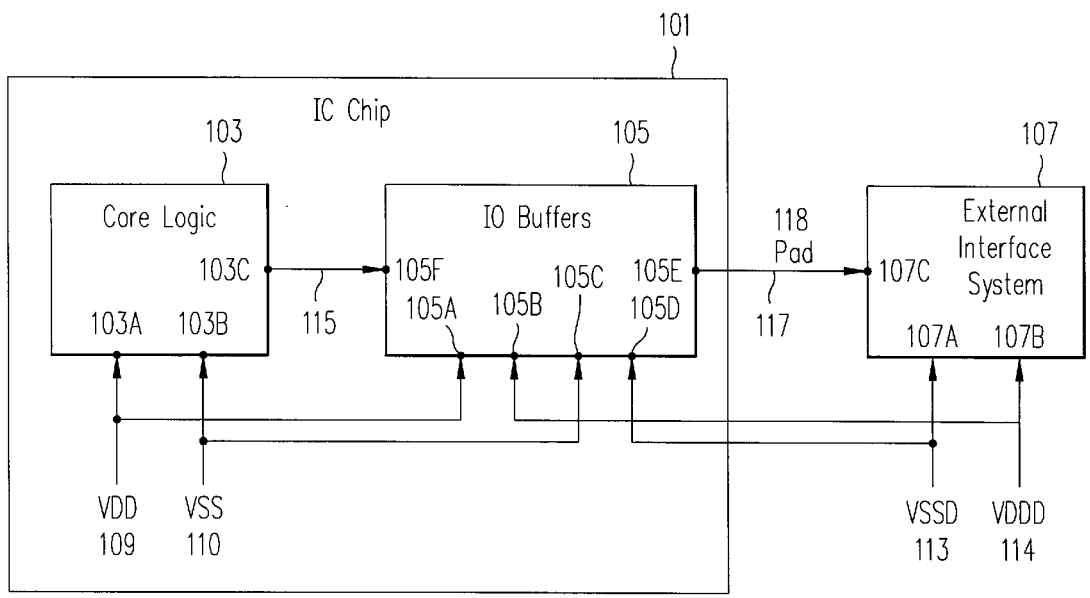
FIG. 1 shows a block diagram of the power supply architecture for an input/output (IO) buffer 105 in accordance with the invention.

FIG. 1 is a block diagram of the power supply architecture for an input/output (IO) buffer in accordance with the invention. Integrated circuit chip 101 includes core logic block 103 and IO buffer block 105. IO buffer block 105 is coupled to an external interface system 107 via pad 118 and bus 117. Core logic block 103 is coupled to IO buffer block 105 via bus 115.

According to the invention, two power supplies are coupled to the integrated circuit 101. One power supply is designated the "noisy" power supply and provides voltages VSSD 113 and VDDD 114 e.g., VSSD 113 is 5.0 volts and VDDD 114 is ground. VSSD 113 is coupled to IO buffer block 105 at input terminal 105D and external interface system 107 at input terminal 107A. VDDD 114 is coupled to IO buffer block 105 at input terminal 105B and external interface system 107 at input terminal 107B.

The second power supply is designated the "quiet" power supply and provides voltages VDD 109 and VSS 110, e.g. VSS 110 is 3.3 volts and VDD 109 is ground. VDD 109 is coupled to core logic block 103 at input terminal 103A and to IO buffer block 105 at input terminal 105A. VSS 110 is coupled to core logic block 103 at input terminal 103B and to IO buffer block 105 at input terminal 105C.

In accordance with the invention, voltages VSSD 113, VDDD 114 and voltages VDD 109, VSS 110 provide a mixed voltage, multi-rail, power supply environment for the operation of IO buffer block 105. This mixed voltage and multi-rail power supply environment allows integrated circuit chip 101 to operate under any of the following conditions:

(1) With core logic block 103 operating at a low or "quiet" voltage (for instance, 3.3 volts) and external interface system 107 operating at a high or "noisy" voltage (for instance, 5.0 volts). In this configuration, the signals on bus 115 from output terminal 103C of core logic block 103 are low or "quiet" voltage logic signals which are coupled to input terminal 105F of IO buffer block 105. The "quiet" voltage logic signals at terminal 105F of IO buffer block 105 are translated by IO buffer block 105 to high or "noisy" voltage logic signals which are coupled, via bus 117, to input terminal 107C of external interface system 107;

(2) With the core logic block 103 operating at a "noisy" voltage and external interface system 107 operating at a "quiet" voltage. In this configuration, the signals at output terminal 103C of core logic block 103 are high voltage logic signals. The high voltage logic signals are translated to low voltage logic signals by IO buffer block 105 and are coupled, via bus 117, to input terminal 107C of external interface system 107;

(3) With core logic block 103 operating at a "noisy" voltage and external interface system 107 also operating at a "noisy" voltage. In this configuration, no translation is required by IO buffer block 105. Therefore, high voltage logic signals at output terminal 103C are coupled, via bus 115, to IO buffer block 105. IO buffer block 105 then couples the signals to terminal 105E, and bus 117, where the high voltage logic signals are coupled to input terminal 107C of external interface system 107;

(4) With core logic block 103 operating at a "quiet" voltage and external interface system 107 also operating at a "quiet" voltage. Once again, no translation is required. Consequently, the signals at output terminal 103C of core logic block 103 are coupled to input terminal 105F of IO buffer block 105 which, in turn, couples the signals to terminal 105E of IO buffer block 105 and bus 117. The low voltage logic signals are then coupled to input terminal 107C of external interface system 107.

A translation scheme to convert signals from one set of power supply voltages, i.e. the "quiet" or "noisy" power supply voltages, to the second set of power supply voltages, i.e., the "noisy" or "quiet" supply voltages, is provided. Consequently circuitry translates signals from VDD 109 and VSS 110 to VSSD 113 and VDDD 114 and vice versa.

Figure 2A:
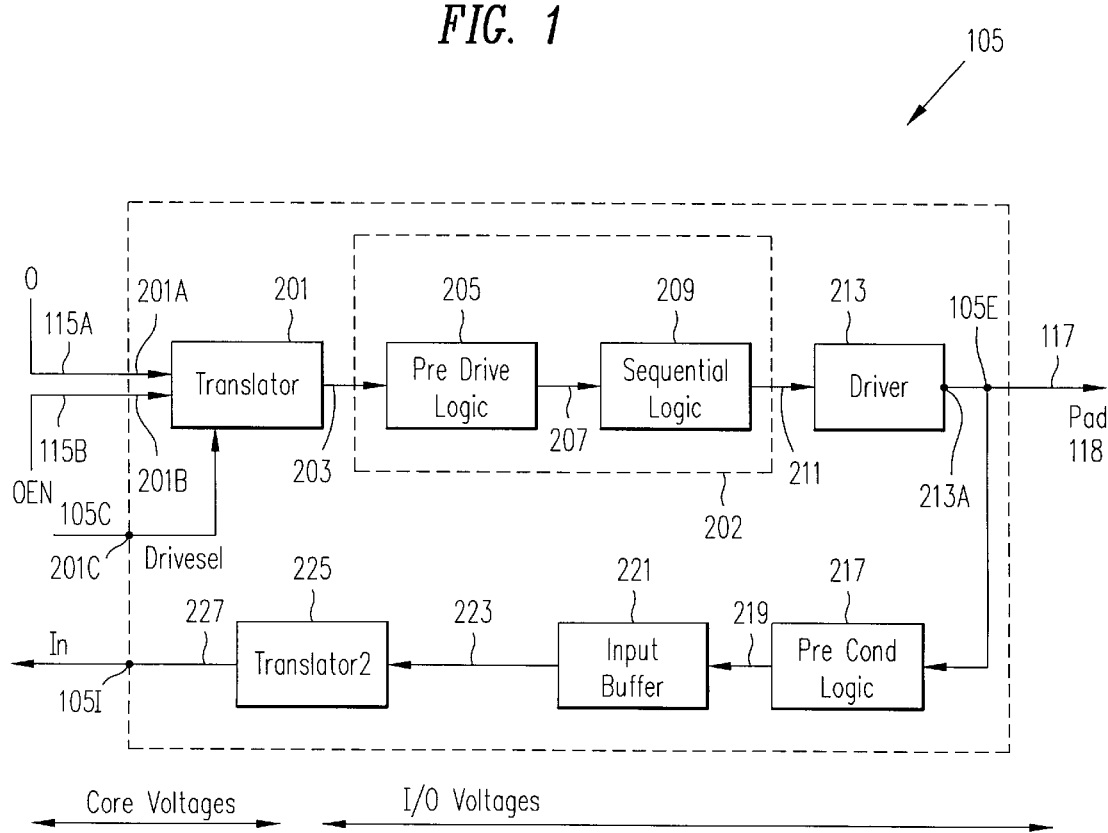
FIG. 2A shows a signal flow diagram for the IO buffer block of FIG. 1.

A diagram of IO buffer block 105 is shown in FIG. 2A. Three signals O, OEN and DriveSel originate from core logic block 103. These signals represent respectively on, on enable, and driver select. Therefore bus 115 is shown as individual lines 115A, 115B and 115C. Signal O is coupled to input terminal 201A of translator 201 via line 115A. Signal OEN is coupled to input terminal 201B of translator 201 via line 115B. Signal DriveSel is coupled to input terminal 201C of translator 201 via line 115C. In one embodiment of the invention, signal DriveSel is low, i.e., zero, for a low drive current and low noise condition, i.e. for a 3.3 volt power supply, and signal DriveSel is high, i.e., one, for a high drive current and high speed condition, i.e., a 5.0 volt supply.

In condition (1) above, i.e., when core logic block 103 uses low voltage logic while external interface system 107 uses high voltage logic, all the signals originating from core logic block 103, i.e., O, OEN, and DriveSel, are converted from "quiet" power supply voltages VDD 109 and VSS 110 to "noisy" power supply voltages VSSD 113 and VDDD 114. Similarly, all signals supplied from external interface system 107 to core logic block 103 are converted from "noisy" power supply voltages VSSD 113 and VDDD 114 to "quiet" power supply voltages VSS 110 and VDD 109. Thus translator 201 takes the incoming signals from core logic block 103 at voltages VDD 109 and VSS 110 and translates them to voltages VSSD 113 and VDDD 114. The translated signals are then coupled by bus 203 to sequencer 202 which includes pre-driver logic block 205 and sequential logic block 209. The signals from pre-driver logic block 205 are coupled to sequential logic block 209, via bus 207. The signals from sequencing block 202 are then coupled to driver 213 via bus 211. Terminal 213A of driver 213 is coupled to terminal 105E of IO buffer block 105, chip pad 118, and bus 117.

On the other hand, signals entering core logic block 103 from external interface system 107 enter IO buffer block 105 at terminal 105E and are coupled to pre-conditioning logic block 217 via bus 215. The signals from pre-conditioning logic block 217 are then coupled to input buffer 221, via bus 219, and from input buffer 221 to translator 225, via bus 223. Translator 225 then translates the signals from noisy power supply voltages VSSD 113 and VSSD 114 to quiet power supply voltages VSS 110 and VDD 109. The translated signals are then coupled, via bus 227, to terminal 105I and core logic block 103 (see FIG. 1).

Figure 2B:
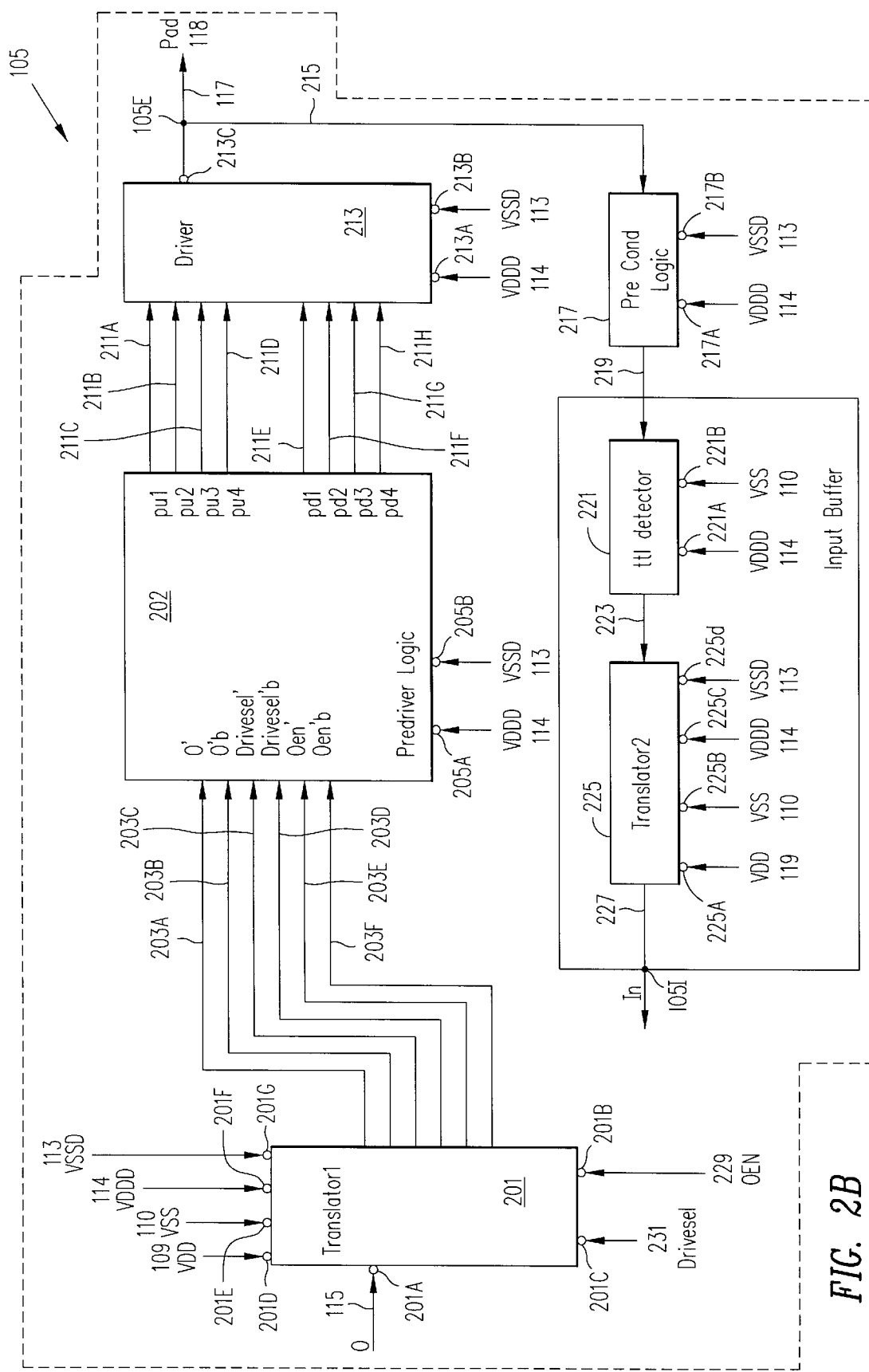
FIG. 2B shows a block diagram for the power connections of the various blocks shown in FIG. 2.

A novel power supply system according to the invention minimizes noise introduced into the internal power supply voltage of integrated circuit chip 101 (see FIG. 1) during the translation of the signals from one power supply voltage to the other power supply voltage. FIG. 2B shows a block diagram for the power connections of the various blocks shown in FIG. 2A. In FIG. 2B, translator 201 receives quiet power supply voltages VDD 109 and VSS 110 and noisy power supply voltages VDDD 114 and VSSD 113 at input terminals 201D, 201E, 201F and 201G, respectively. Translator 201 takes input signals O, OEN and DriveSel from core logic block 103 at input terminals 201A, 201B and 201C, respectively, and translates them from quiet power supply voltages VDD 109 and VSS 110 to noisy power supply voltages VDDD 114 and VSSD 113. In the translation process, translator 201 generates signals O', O'b, DriveSel', DriveSel'b, OEN' and OEN'b, at voltages VSSD 113 and VDDD 114. Signals O', O'b, DriveSel', DriveSel'b, OEN', and OEN'b, are coupled to sequencing block 202 via lines 203A, 203B, 203C, 203D, 203E, and 203F, respectively, of bus 203 (see FIG. 2A).

Sequencing block 202 also includes a VDDD input terminal 205A and a VSSD input terminal 205B. In one embodiment of the invention, sequencing block 202 generates four pull-up signals: pu1; pu2; pu3; and pu4, as well as four pull-down signals: pd1; pd2; pd3; and pd4. Signals pu1–pu4 and pd1–pd4 are then coupled to driver 213 via lines 211A–211H, respectively.

Driver 213 includes a VDDD input terminal 213A and a VSSD input terminal 213B. Signals from driver 213 are coupled to output terminal 213C of driver 213 and terminal 105E of IO buffer block 105.

A signal from external interface system 107 (see FIG. 2A) to be coupled to core logic block 103 enters IO buffer block 105 at terminal 105E. The incoming signal is then coupled to pre-condition logic block 217 via bus 215. Preconditioning logic block 217 includes a VDDD 114 input terminal 217A and a VSSD 113 input terminal 217B (see FIG. 2B).

The signals from pre-conditioning logic block 217 are coupled to TTL detector/input buffer 221 via bus 219. TTL detector/input buffer 221 operates at a hybrid set of power supply voltages including VDDD 114 at input terminal 221A and VSS 110 at input terminal 221B. This hybrid set of power supply voltages is employed because the low noise condition at VSS 110 makes it easier to control the trip points and VL limits of TTL detector/input buffer 221 (as described in the PCI Local Bus Specification Rev. 0.1).

The signal from TTL detector/input buffer 221 is coupled to translator 225 via bus 223. As with translator 201, translator 225 includes VDD 119 and VSS 110 inputs at terminals 225A and 225B, respectively, and VDDD 114 and VSSD 113 inputs at input terminals 225C and 225D, respectively. Translator 225 takes the signals from TTL detector/ input buffer 221 at voltages VDDD 114 and VSS 110 and translates them to power supply voltages VDD 119 and VSS 110.

IO buffer block 105 of FIGS. 2A and 2B is merely one embodiment of an IO buffer in accordance with the invention. Those skilled in the art will recognize that other embodiments are possible. For instance, translator 201 can be placed anywhere in the signal path such as connected between the pad 118 and the output terminals of the IO buffer block. The only requirement is that all the logic on the input side of translator 201 be supplied with one power supply voltage such as the quiet power supply voltages VDD 109 and VSS 110, while the signals on the output side of translator 201 are supplied with the other power supply voltage, such as the noisy power supply voltages VDDD 114 and VSSD 113, or vice versa. Similarly, translator 225 alternatively is connected between TTL detector/input buffer 221 and pad 118. In addition, when it is desired to operate IO buffer block 105 under conditions 3 and 4 discussed above, i.e. when core logic block 103 is operating at the same voltage level as external interface system 107 (see FIG. 1), no translators 201 or 225 are required. Under these conditions, all that is required is that the input logic always operate at the same voltage level as the output logic, i.e., either at VDD 109 and VSS 110 or at VSSD 113 and VDDD 114.

Figure 2C:
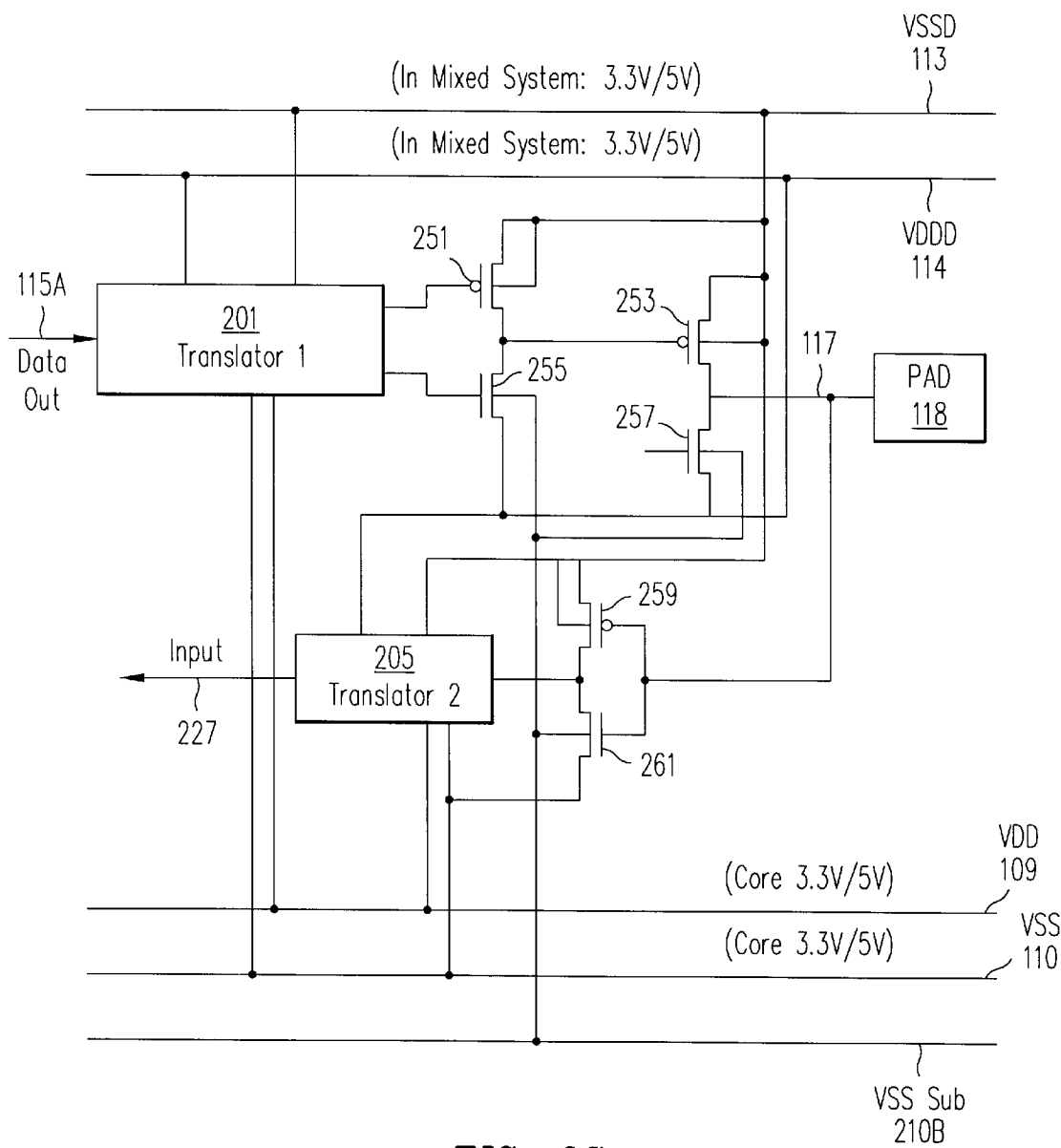
FIG. 2C shows one embodiment of the power supply connection used to isolate the input buffer of FIG. 2A from noise generated by the translator, the sequencer and driver of FIG. 2A.

FIG. 2C shows one embodiment of the power supply connections used to isolate input buffer 221 (see FIG. 2A) from the noise generated by translator 201, sequencer 202, and driver 213. Transistors 251,255 represent a simplified version of sequencer 202 of FIG. 2B; transistors 253,257 represent a simplified version of driver 213 of FIG. 2B; and transistors 259,261 represent a simplified version of input buffer 221 of FIG. 2B. Translator 205 is the same structure as translator 225 of FIG. 2B, and voltage supply VSS sub is the chip substrate ground connection. Also shown in FIG. 2C are noisy power supply voltages VSSD 113 and VDDD 114, quiet power supply voltages VDD 109 and VSS 110, as well as substrate voltage VSSS sub 210B.

Figure 3A:
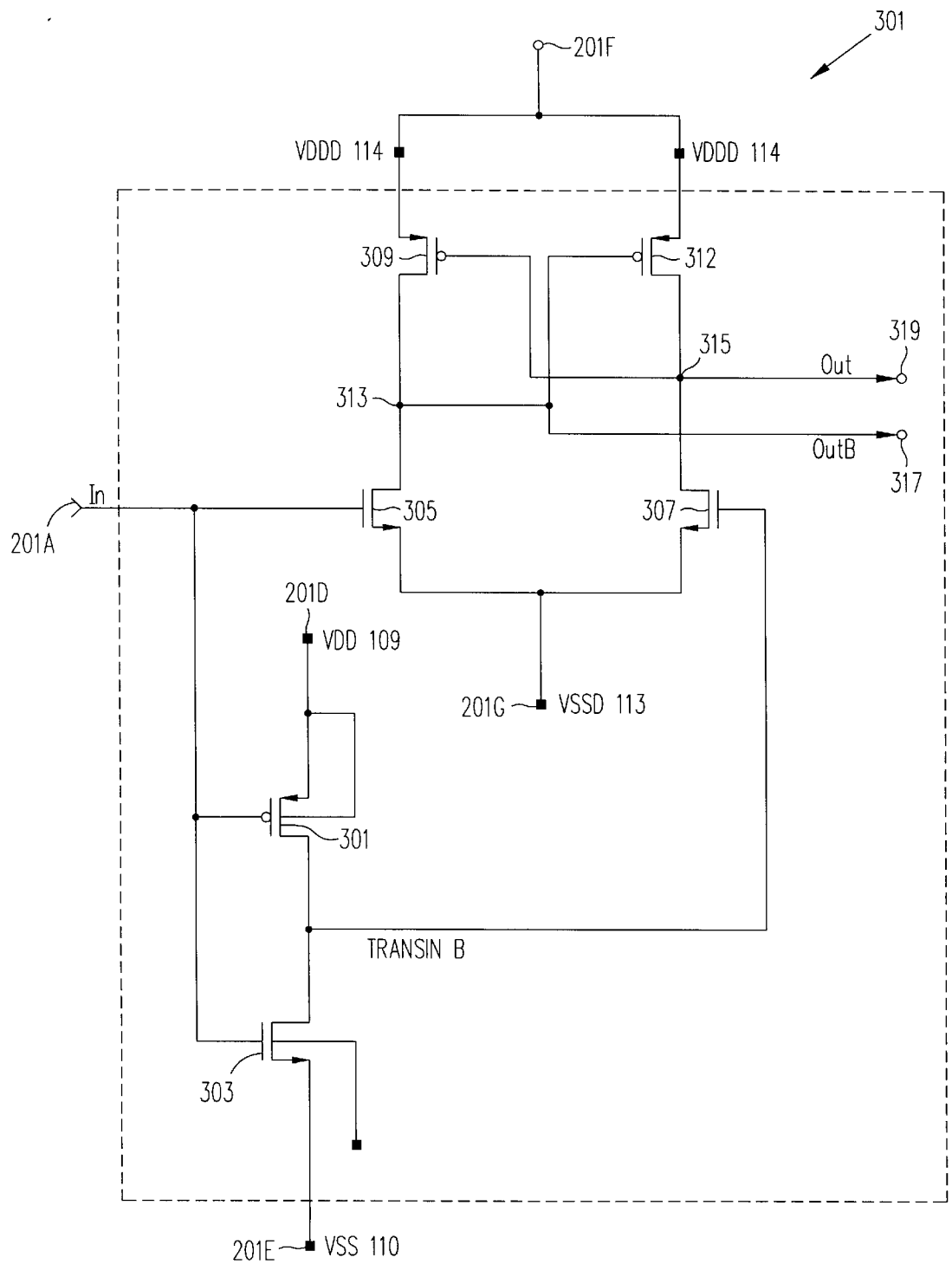
FIG. 3A shows one embodiment of a translator circuit according to the invention.

One embodiment of a translator 301 (i.e., translators 201, 225 of FIG. 2A) is shown in FIG. 3A. The signal "IN" at input terminal 201A of translator 301 is, in this example, the signal "O" from bus 115 of FIG. 2B. However, the signal at input terminal 201A can be any input signal from core logic block 103. Signals "IN" and "TRANSINB" are complements, i.e. 180° out of phase, and are generated at the same power supply voltages, VDD 109 and VSS 110, because the inverter including transistors 301 and 303 is connected to VDD 109 at terminal 201D and to VSS 110 at terminal 201E (see FIGS. 2B and 3A).

Signals "IN" and "TRANSINB" are coupled to the gates of NMOS transistors 305 and 307, respectively, and then coupled to cross-coupled PMOS transistors 309 and 311 (see FIG. 3A). Initially signal "IN" is low and signal "TRANSINB" is high. Consequently, transistor 305 is not conducting and transistor 307 is conducting. When the circuit is in this state, transistor 309 is conducting and node 313 is at voltage VDD 114 while transistor 311 is not conducting and node 315 is pulled to VSSD 113 by transistor 307.

When signal "IN" goes high, signal "TRANSINBI" goes low. Consequently, transistor 309 is conducting and transistor 311 is not conducting. When the circuit is in this state, node 313 is pulled down to VSSD 113 if the conduction of transistor 305 is strong enough to overcome transistor 309, this, in turn, causes transistor 311 to conduct and node 315 is pulled up to VDDD 114. When node 315 is pulled up to VDDD 114, transistor 309 is not conducting.

Node 313 is coupled to output terminal 317 which is the "OUTB" output terminal. Signals O'b, DriveSel'b and OEN'b are generated at OUTB terminal 317. Node 315 is coupled to output terminal 319 which is the "OUT" output terminal. Signals O', DriveSel' and OEN' are generated at OUT terminal 319. Since nodes 313 and 315 are coupled to VDDD 114 and VSSD 113, input signal "IN", at quiet power supply voltages VDD 109 and VSS 110, is translated to output signals OUT and OUTB at noisy power voltages VDDD 114 and VSSD 113. As those skilled in the art will recognize, the circuit shown in FIG. 3A also includes positive feedback and hence is very "well behaved".

Figure 3B:
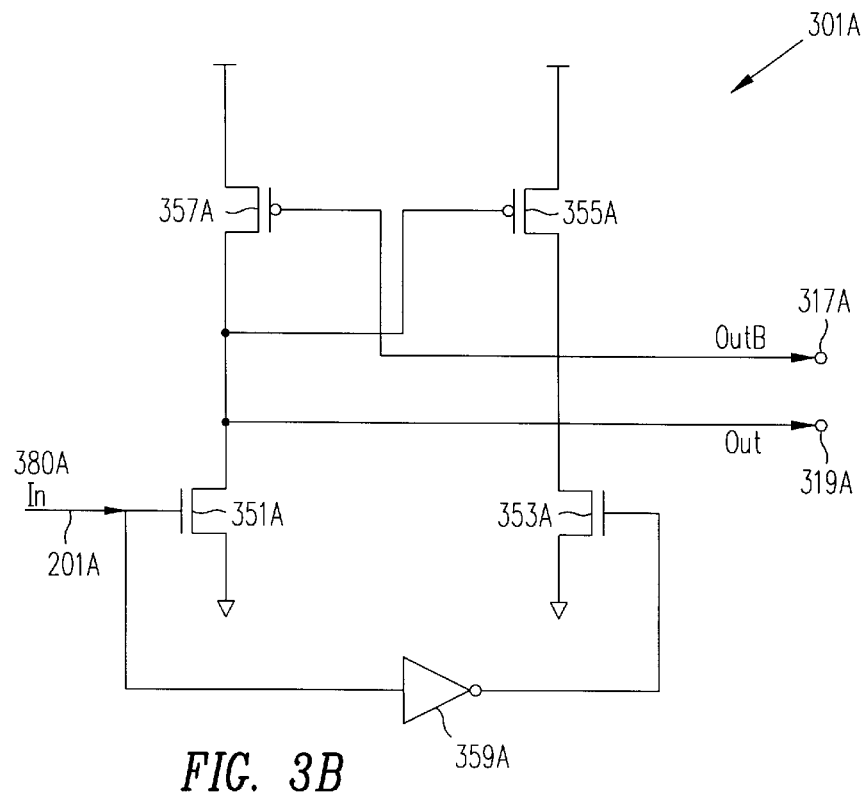
FIG. 3B shows a second embodiment of a translator in accordance with the invention.

FIGS. 3B–3E show four other embodiments of a translator in accordance with the invention. FIG. 3B shows a translator 301A including NMOS transistors 351A and 353A and cross coupled PMOS transistors 355A and 357A. Input signal 380A is coupled to input terminal 201A of translator 301A. Translator 301A also includes output terminal 317A, which is the "OUTB" output terminal and output terminal 319A, which is the "OUT" output terminal.

Figure 3C:
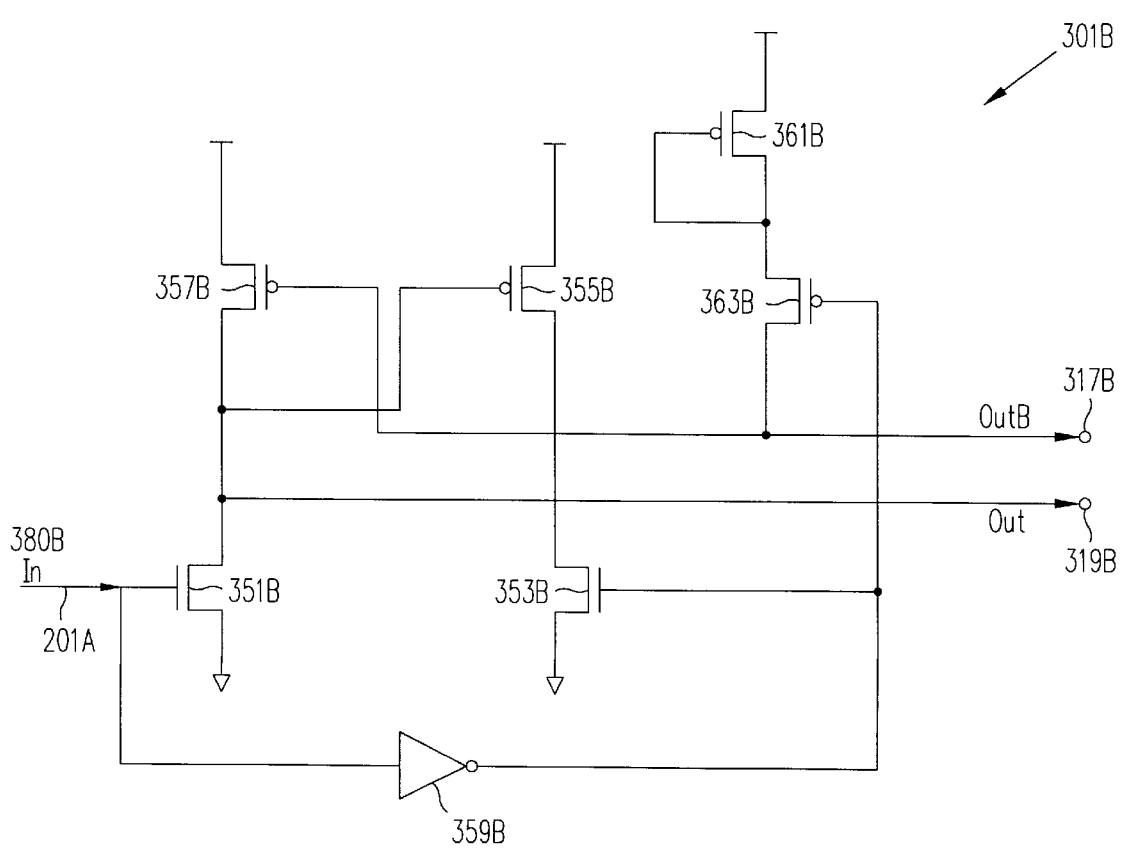
FIG. 3C shows a third embodiment of a translator in accordance with the invention.

FIG. 3C shows a third embodiment of a translator 301B. Translator 301B includes NMOS transistors 351B and 353B and cross coupled PMOS transistors 357B and 355B. In addition, translator 301B includes PMOS transistors 361B and 363B. Translator 301B also includes inverter 359B. An input signal 380B is coupled to input terminal 201A. Translator 301B also includes output terminal 317B which is the "OUTB" output terminal and output terminal 319B which is the "OUT" output terminal.

Figure 3D:
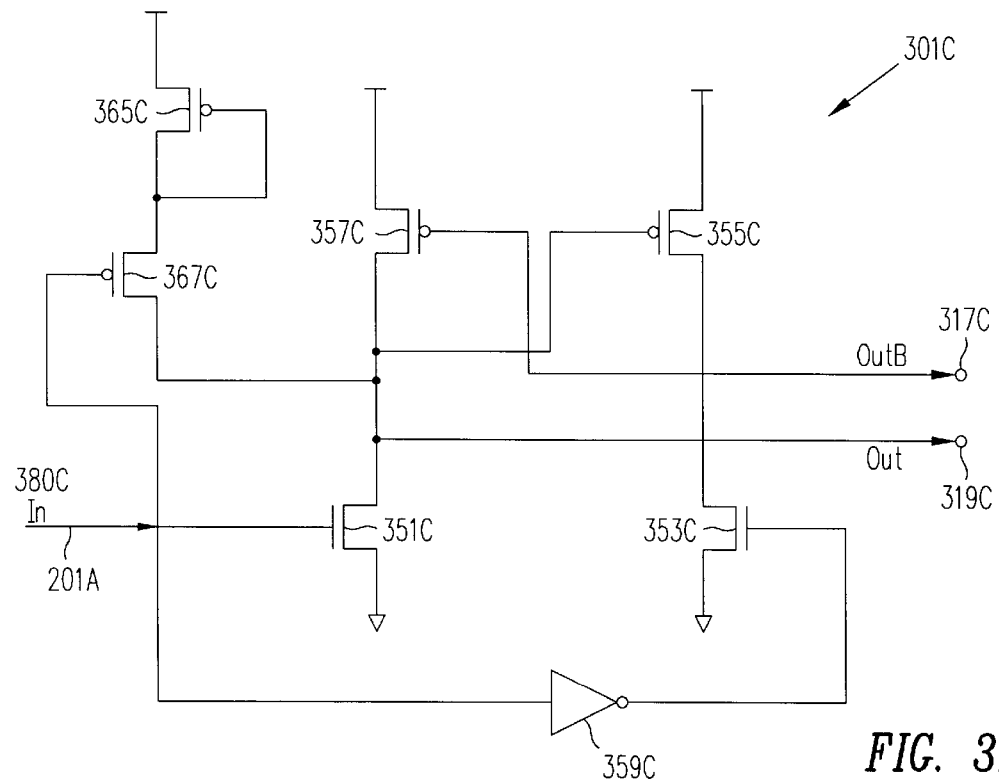
FIG. 3D shows a fourth embodiment of a translator in accordance with the invention.

FIG. 3D shows a fourth embodiment of a translator 301C. Translator 301C includes NMOS transistors 351C and 353C and cross coupled PMOS transistors 357C and 355C. In addition, translator 301C includes PMOS transistors 367C and 365C. Translator 301C also includes inverter 359C. An input signal 380C is coupled to input terminal 201A. Translator 301C includes an "OUTB" output terminal 317C and an "OUT" output terminal 319C.

Figure 3E:
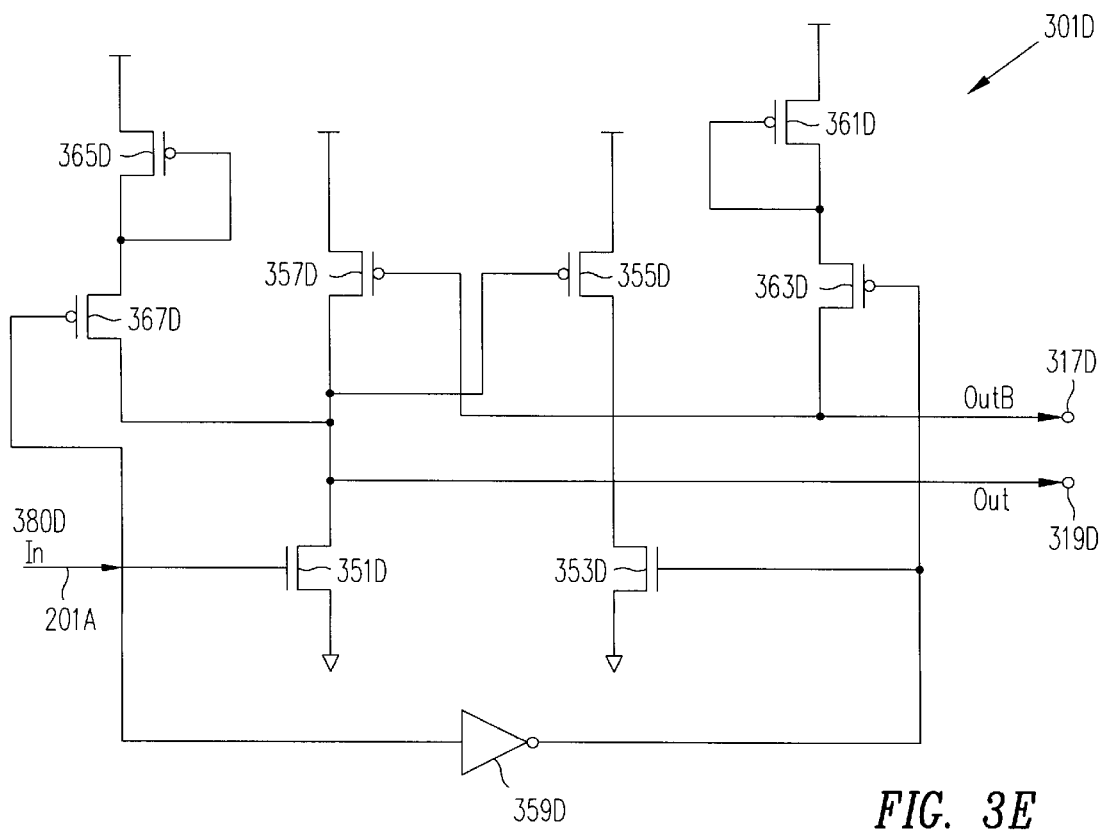
FIG. 3E shows a fifth embodiment of a translator in accordance with the invention.

FIG. 3E shows a fifth embodiment of a translator 301D. Translator 301D includes NMOS transistors 351D and 353D as well as cross coupled PMOS transistors 357D and 355D. In addition, translator 301D includes PMOS transistors 361D, 363D, 367D and 365D. Translator 301D also includes invertor 359D. An input signal 380D is coupled to input terminal 201A. Translator 301D also includes an "OUTB" output terminal 317D and an "OUT" output terminal 319D.

Figure 3F:
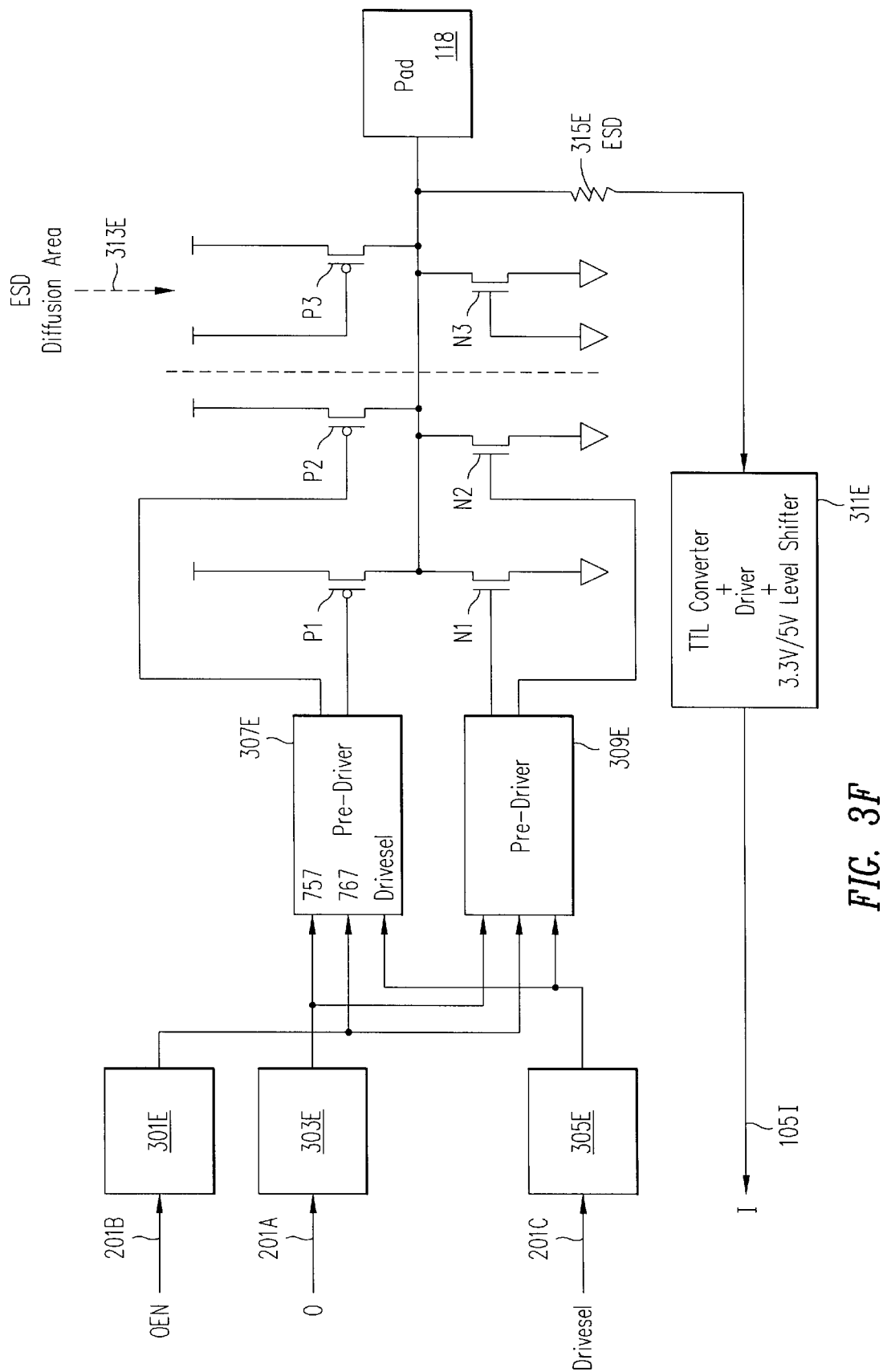
FIG. 3F shows a typical scheme for connecting a series of translators in accordance with the invention to a pre-driver logic block of the sequencer in FIG. 2A.

FIG. 3F shows a typical scheme for connecting a series of translators 301E, 303E, and 305E in accordance with the invention to pre-driver logic blocks 307E and 309E. Translators 301E, 303E, 305E together are the translator 201 of FIG. 2B. For detail of blocks 307E, 309E see elements 751A, 751B of FIG. 7B. Signal OEN is coupled to input terminal 201B of translator 301E. Signal O is coupled to input terminal 201A of translator 303E, and signal DriveSel is coupled to input terminal 201C of translator 305E. The signals from translators 301E, 303E and 305E, are, in turn, coupled to pre-driver logic blocks 307E and 309E. Transistors P1, P2, P3, N1, N2, N3 are one version of driver 213 of FIG. 2B. Pad 118 is coupled to block 311E via bus 215. Block 311E includes TTL detector 221, preconditioning logic 217, and translator2 225 (see FIG. 2B). The output terminal of block 311E is coupled to output terminal 105I.

Figure 4:
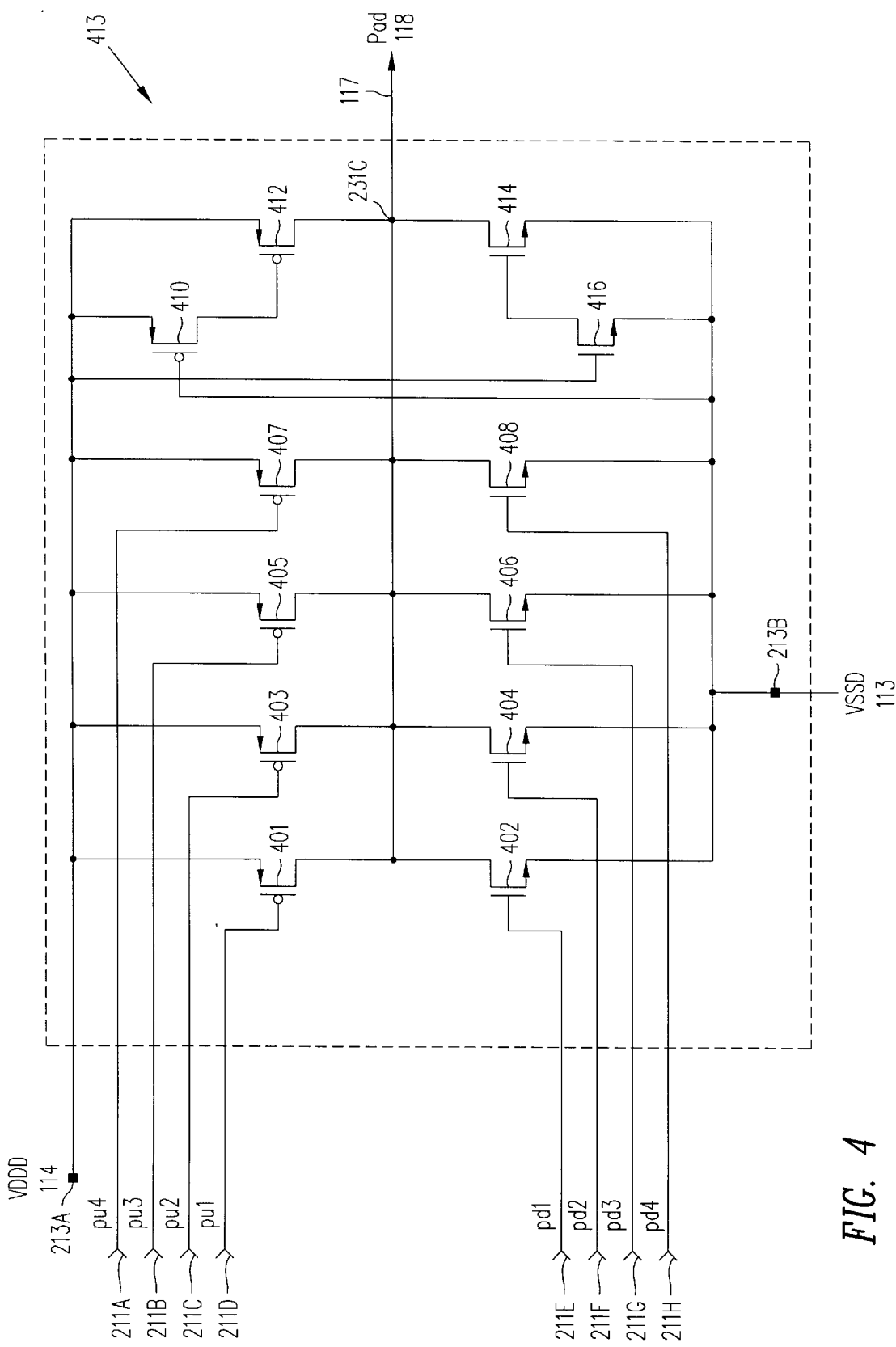
FIG. 4 shows one embodiment of a driver from FIGS. 2A and 2B.

One embodiment of a driver (see driver 213 in FIGS. 2A and 2B) is shown in FIG. 4. The driver 413 of FIG. 4 includes four stages of PMOS current driving transistors 401, 403, 405, and 407 and four stages of NMOS current driving transistors 402, 404, 406, and 408. Also included are PMOS output transistors 410 and 412 and NMOS output transistors 414 and 416. Transistor 412 is kept turned off by pulling its gate to VDDD by use of transistor 410 which is always turned on. Transistor 414 is kept off by pulling its gate to ground (i.e. VSSD) by use of transistor 416 which is always turned on. Transistors 412, 414 are for ESD protection. Transistors 410, 416 are used to isolate the gates of transistors 412, 414 from the supply voltages.

According to the invention, the main current driving transistors 401–408 are divided into four pull-up stages, which include PMOS transistors 401, 403, 405, and 407, and four pull-down stages, which include NMOS transistors 402, 404, 406 and 408. In one embodiment of the invention, each transistor stage is turned on after a small amount of delay from the previous stage. This configuration effectively controls the amount of current that flows out of the load capacitance (not shown). Load capacitance is the capacitance of the external interface circuit 107 (of FIG. 1) as seen by the output buffers 105 on bus 117. Thus, the voltage drop across the VSS 110 and VDD 109 busses is controlled. Consequently, this configuration translates directly into a reduction of ground/power bounce. In a practical circuit ground is not always 0v but moves up and down during operation, this is called ground bounce. The peak of this voltage bump is proportional to the rate of change of current through the VSSD or VDDD nodes.

In order to operate the circuitry shown in FIG. 4, a circuit for turning each transistor stage on and off in sequence is provided to avoid shorting power and ground voltage supplies together and thus drawing large amounts of current. As the driver transistors 401–408 become larger, a sequencer means becomes more important. Additionally, the sequence for turning each pull-up stage, i.e. transistors 401, 403, 405, and 407, or pull-down stage, i.e., transistors 402, 404, 406, and 408, on and off affects the delay involved in the propagation of the signals from input to output. Thus the sequence is optimized for the shortest propagation delay. However, the desire for a short delay is balanced against any inductive effects in order to minimize potential discontinuities in the change in current over time (dI/dt) of the load that can happen at the time when transistors 401, 403, 405, 407, 402, 404, 406, 408 turn on.

In one embodiment of the invention, the sequencing, i.e. the turning on and turning off of driver transistors 401–408, is accomplished by sequencer 202 (see FIGS. 2A and 2B). As discussed in more detail below, sequencer block 202 implements several of the major functions of IO buffer block 105. For instance, sequencer 202 controls the tri-state output, the on-the-fly selection of drive strength, the sequencing of the eight driver transistors 401–408 (see FIG. 4), the control of the signal propagation delay through IO buffer 105, and the amount of "crow bar" current used by the system. A more detailed discussion of these features is provided below.

Figure 5A:
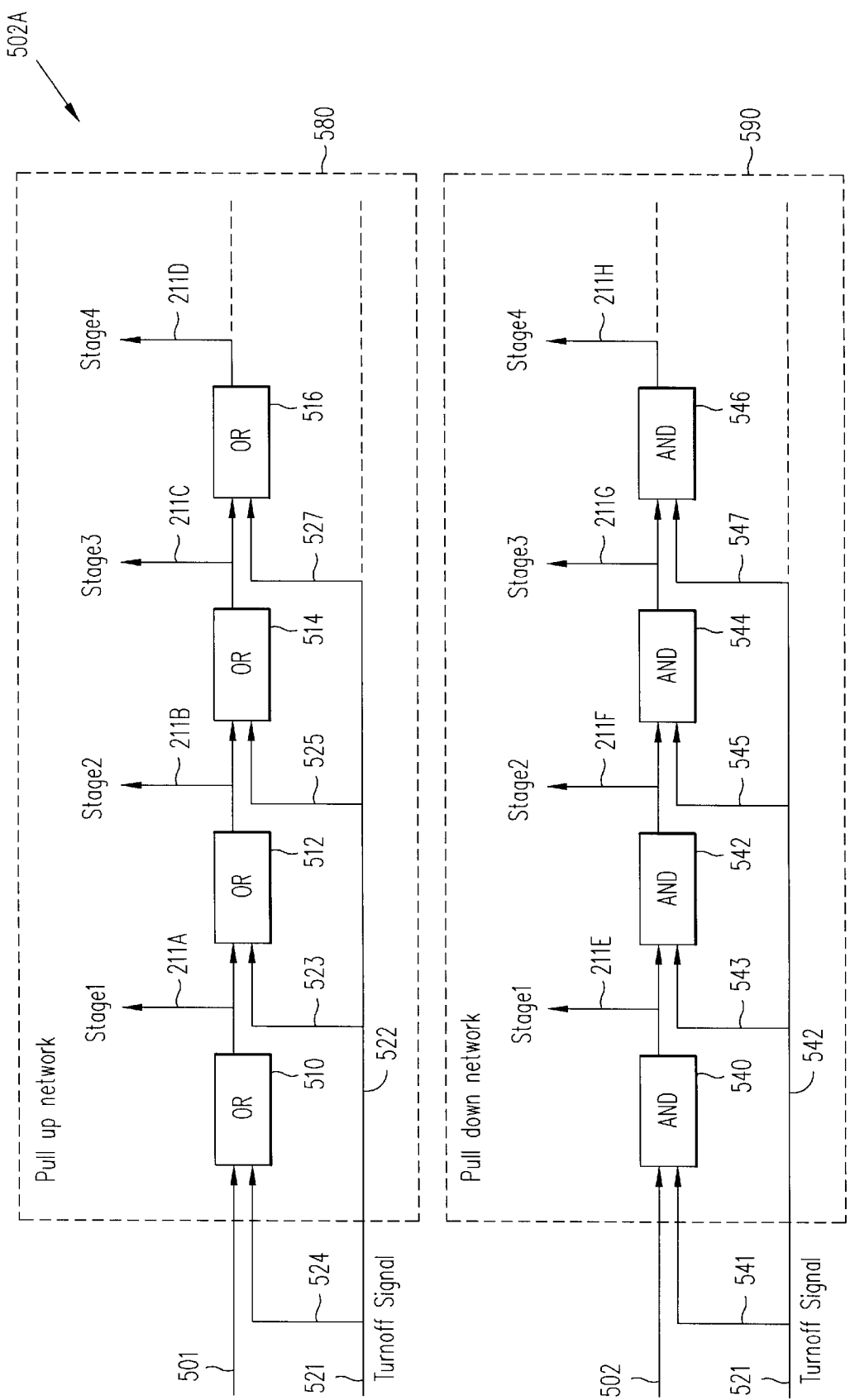
FIG. 5A shows a block diagram of one implementation of a sequencer for an arbitrary number of pull-up driver stages.

FIG. 5A shows a block diagram of one implementation of a sequencer 502A for an arbitrary number of pull-up stages. Exemplary input signals 501 and 502 and exemplary turn off signal 521 are coupled to sequencer 502A as shown in FIG. 5A.

The pull-up network 580 of sequencer 502A includes ORGATES 510, 512, 514 and 516. The output terminal of ORGATE 510 is coupled to one input terminal of ORGATE 512 and bus 211A. Bus 211A is coupled to pull-up stage 1 (transistor 401) of driver 413 (see FIG. 4). The output terminal of ORGATE 512 is coupled to an input terminal of ORGATE 514 and bus 211B. Bus 211B is coupled to pull-up stage 2 (transistor 403) of driver 413 (see FIG. 4). The output terminal of ORGATE 514 is coupled to an input terminal of ORGATE 516 and bus 211C. Bus 211C is coupled to pull-up stage 3 (transistor 405) of driver 413 (see FIG. 4). The output terminal of ORGATE 516 can be coupled to the input terminal of another ORGATE (not shown) and bus 211D. Bus 211D is coupled to pull-up stage 4 (transistor 407) of driver 413 (see FIG. 4). In addition, the chain of ORGATES and output buses can be extended to any desired number of pull-up stages. Turn off signal 521 is coupled by line 522 and to ORGATES 510, 512, 514, and 516 via taps 524, 523, 525, and 527 respectively.

The pull-down network 590 of sequencer 502A, shown in FIG. 5A, includes ANDGATES 540, 542, 544, and 546. Signal 502 is coupled to one input terminal of ANDGATE 540. The output terminal of ANDGATE 540 is coupled to an input terminal of ANDGATE 542 and bus 211E. Bus 211E is coupled to pull-down stage 1 (transistor 402) of driver 413 (see FIG. 4). The output terminal of ANDGATE 542 is coupled to an input terminal of ANDGATE 544 and bus 211F. Bus 211F is coupled to pull-down stage 2 (transistor 404) of driver 413 (see FIG. 4). The output terminal of ANDGATE 544 is coupled to an input terminal of ANDGATE 546 and bus 211G. Bus 211G is coupled to pull-down stage 3 (transistor 406) of driver 413 (see FIG. 4). The output terminal of ANDGATE 546 can then be coupled to the input terminal of another ANDGATE (not shown) and bus 211H. Bus 211H is coupled to pull-down stage 4 (transistor 408) of driver 413 (see FIG. 4). The chain of ANDGATES and output buses can be extended to drive any desired number of pull-down stages. Turn off signal 520 is coupled to line 542 and ANDGATES 540, 542, 544, and 546 via taps 541, 543, 545, and 547.

As those of skill in the art will recognize, when turn off signal 520 switches from a high state, i.e. a digital one, to a low state, i.e. a digital zero, all of the signals on buses 211E, 211F, 211G, and 211H of pull-down network 590 go low simultaneously. At the same time, a shift of turn off signal 520 from low to high causes signal 501 to propagate through pull-up network 580 and if signal 501 is low, then the signals on buses 211A, 211B, 211C, and 211D go low one after another in sequence. Consequently, signal pu1 on bus 211A to transistor 403 (see FIG. 4) goes low first, then, after a pre-determined delay, signal pu2 on bus 211B to transistor 405 goes low and, after a second delay, signal pu3 on bus 211C to transistor 407 goes low and then, after a third delay, signal pu4 on bus 211C to transistor 409 goes low and so on. In one embodiment of the invention, the delays between stages are determined by the size of the transistors in each stage and are typically approximately 0.5 ns.

On the other hand, when turn off signal 520 transitions from a high state to a low state, the signals on buses 211A, 211B, 211C, and 211D go low simultaneously. If, at the same time, signal 502 is high, then signal 502 will propagate through pull-down network 590. Under these conditions, signal pd1 on bus 211E to transistor 402 (see FIG. 4) will go low first, then, after a pre-determined delay, signal pd2 on bus 211F to transistor 404 will go low, then, after a second delay, signal pd3 on bus 211G to transistor 406 will go low, and then, after a third delay, signal pd4 on bus 211H to transistor 408 will go low and so on.

Figure 5B:
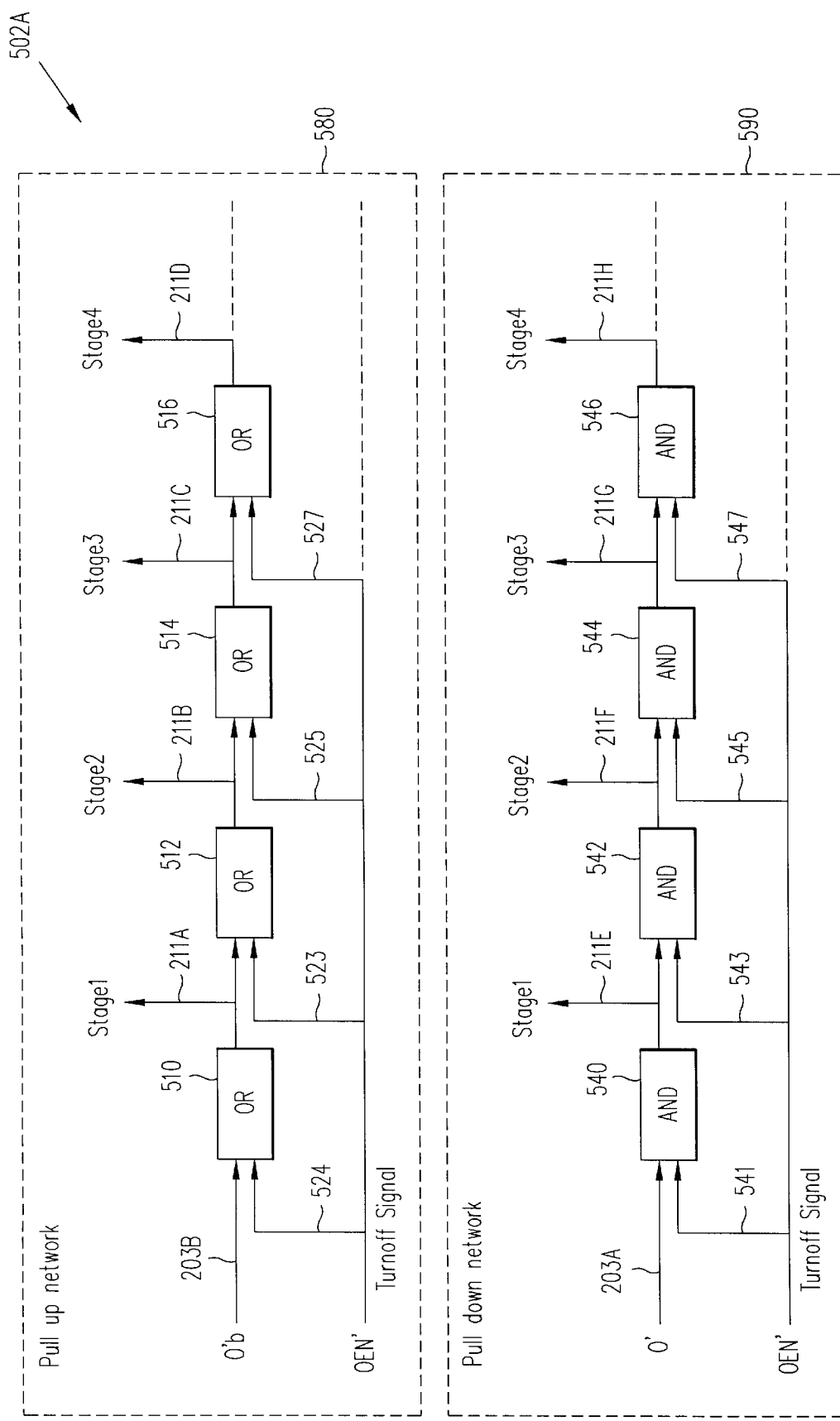
FIG. 5B shows an embodiment of the sequencer of FIG. 5A configured so that the input signals are used as enable/disable signals for tri-stating the buffer according to the invention.

In one embodiment of the invention, sequencer 502A is configured so that signals 501 and 502 are used as enable/disable signals for tri-stating buffer 105 (see FIG. 1). One such implementation is shown in FIG. 5B. In FIG. 5B, signal 502 from FIG. 5A is signal O' from line 203A of bus 203 (see FIG. 2A) and signal 501 in FIG. 5A is signal O'b from line 203B of bus 203 (see FIG. 2A). In FIG. 5B, turn off signal 520 (FIG. 5A) is signal OEN' from line 203E of bus 203 (see FIG. 2B).

In addition, in other embodiments of the invention, turn off signal 520 itself can simply be the complement, i.e. a signal 180° out of phase, of the input signal to IO buffer block 205.

Figures 1, 5C:
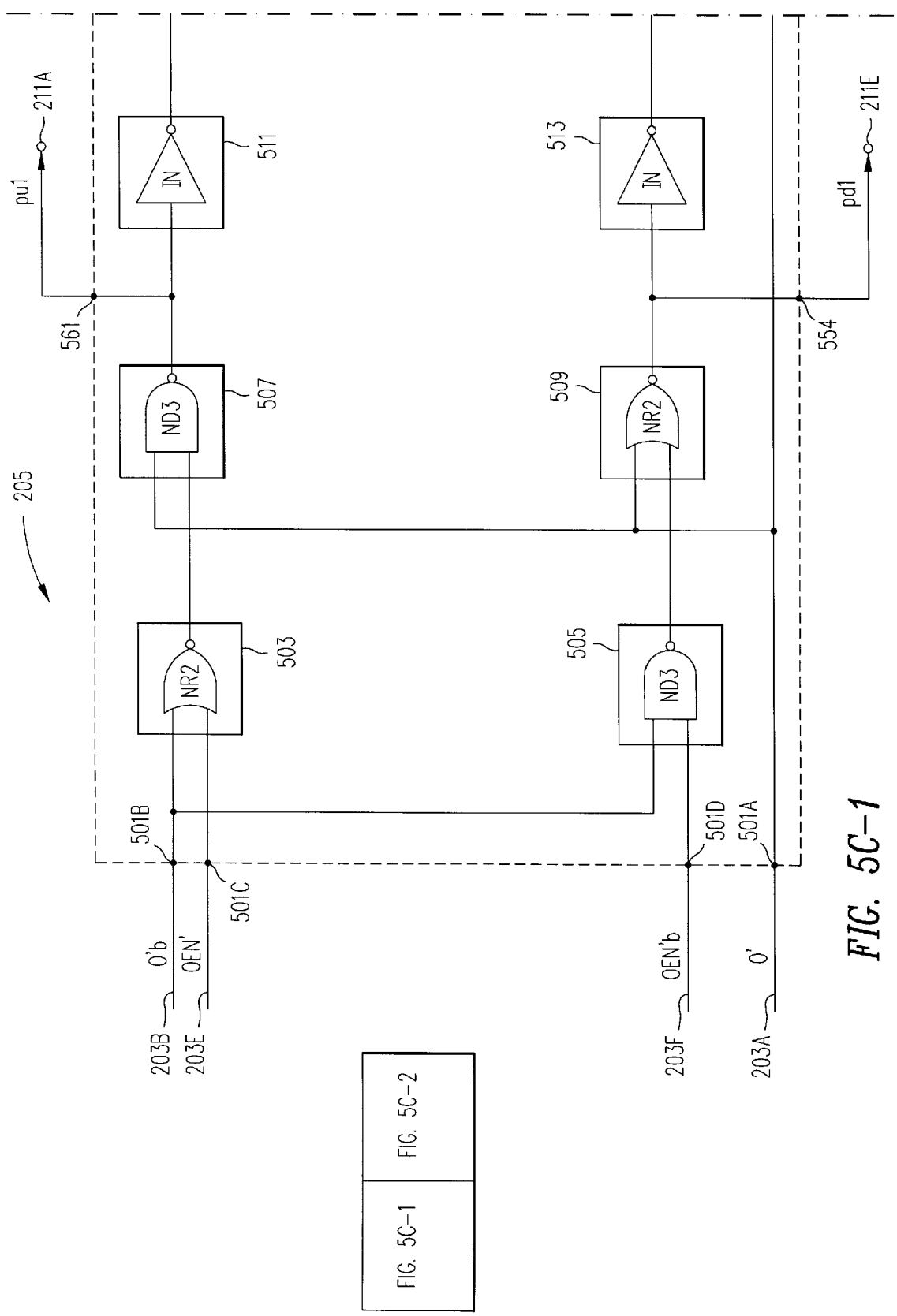
FIG. 5C shows a gate level schematic of one embodiment of a sequencer such as the sequencer shown in FIGS. 5A and 5B.
Figures 2, 5C:
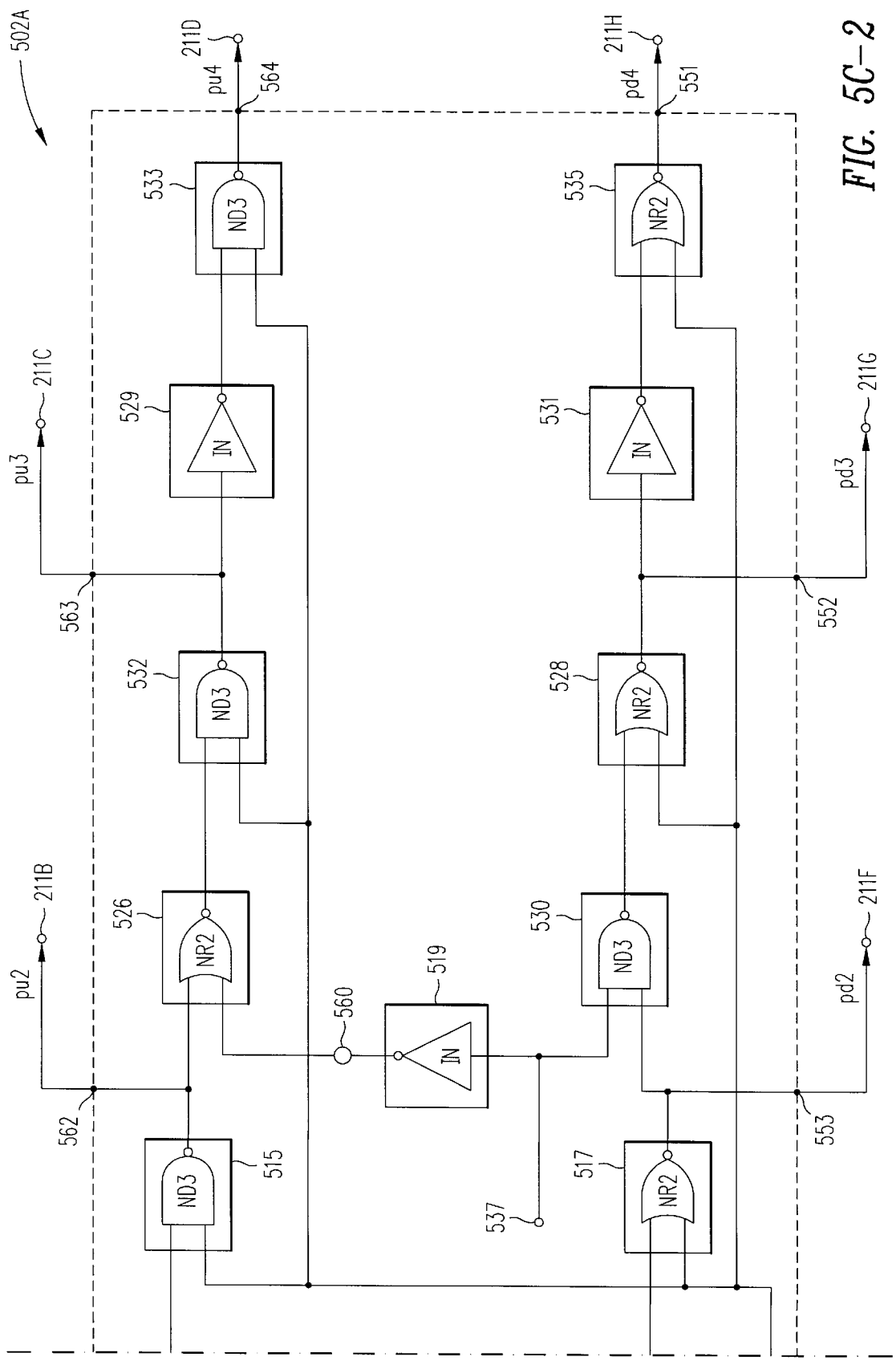

FIG. 5C shows a gate level schematic of one embodiment of a sequencer such as sequencer 502A shown in FIGS. 5A and 5B. In FIG. 5C, the signal DriveSel' from bus 203C of translator block 201 (see FIG. 2A) is coupled to input terminal 537 (see FIG. 5A) and signal DriveSel'b is generated at node 560 by invertor 519. Signals O', O'b, OEN' and OEN'b are coupled, via lines 203A, 203B, 203E, and 203F, respectively, to input terminals 501A, 501B, 501C and 501D, respectively. The embodiment of sequencing block 502A shown in FIG. 5C also includes several basic logic elements well known to those of skill in the art such as: NORGATES 503, 509, 517, 526, 528, and 535; NANDGATES 505, 507, 515, 530, 532, and 533; and inverters 511, 513, 519, 529, and 531.

The embodiment of sequencing block 502A shown in FIG. 5C also includes eight output terminals 551–554 and 561–564. Pull-up signals pu1–pu4 (see FIG. 2B) are coupled to output terminals 561–564 (see FIG. 5C) and buses 211A–211D. Buses 211A–211D are, in turn, coupled to driver 413 as shown in FIG. 4. Similarly, pull-down signals pd1–pd4 (see FIG. 2B) are coupled to output terminals 551–554 (see FIG. 5C) and buses 211E–211H. Buses 211E–211H are, in turn, coupled to driver 413 as shown in FIG. 4.

Those of skill in the art will recognize that, due to the operation of the various logic elements shown in FIG. 5C, when signal OEN' at input terminal 501C is high and signal OEN'b at input terminal 501D is low, signals pu1–pu4 go high and signals pd1–pd4 go low. Referring to FIG. 4, when signals pu1–pu4 on buses 211A–211D, respectively, go high, PMOS driver transistors 401, 403, 405, and 407 are disabled, i.e., do not conduct. Further, when signals pd1–pd4 on buses 211E–211H, respectively, go low, NMOS driver transistors 402, 404, 406, and 408 also disabled and, therefore, output terminal 213C of driver 413 (see FIG. 2B) is floating irrespective of all other signals, i.e., node 213C is not driven by any logic gate. This condition is also known as tristate.

When signal DriveSel'b (see FIG. 2B) is low, signals pu3 and pu4 are high and signals pd3 and pd4 are also high. Therefore, NMOS driver transistors 406 and 408 are disabled as are PMOS driver transistors 405 and 407, as a result of which the total width of the transistor driving the node is reduced, i.e. instead of four, only two transistors are turned on reducing the driving strength of driver.

When the circuitry shown in FIG. 5C is in the state described above, i.e., when signal O' at input terminal 501A goes low, the outputs of NANDGATES 505, 507, 515, 530, 532, and 533 go high and signals pu1–pu4 also go high. Consequently, PMOS driver transistors 401, 403, 405, and 407 (see FIG. 4) do not conduct. At the same time, signal O'b is coupled to output terminals 551–554 without any inversion. Consequently, NMOS driver transistors 402, 404, 406, and 408 (see FIG. 4) turn on which causes the signal at output terminal 213C of driver 413 to go low.

Similarly, when signal O' goes high, the outputs of NORGATES 503, 509, 517, 526, 528, and 535 go low and the low output signals are coupled to output terminals 551–554 (see FIG. 5C). Consequently, NMOS transistors 402, 404, 406, and 408 are turned off (see FIG. 4). At the same time, signal O'b goes low and is coupled to output terminals 561–564 (see FIG. 5C) and PMOS transistors 401, 403, 405, and 407 (see FIG. 4) are turned on. Consequently, the signal at output terminal 213C of driver 413 (see FIG. 4) goes high.

Figure 5D:
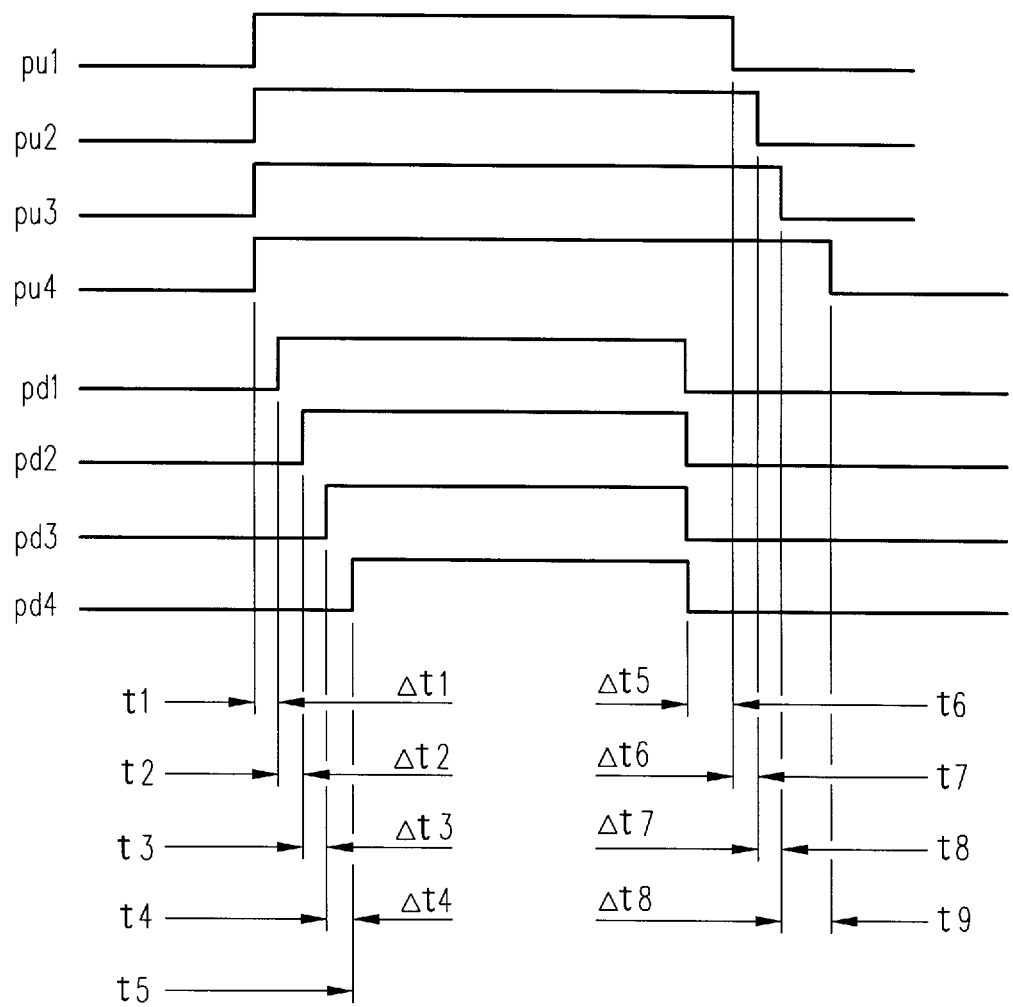
FIG. 5D shows a signal diagram for the embodiment of a sequencer shown in FIG. 5C.

FIG. 5D shows a signal timing diagram for one embodiment of sequencer 502A of FIG. 5C. As seen in FIG. 5D, according to the invention a small amount of overlap time, times Δt1–Δt8, during which both NMOS drive transistors 402, 404, 406, and 408, and PMOS drive transistors 401, 403, 405, and 407 (see FIG. 4) are conducting is introduced. When both NMOS transistors 402, 404, 406, and 408 and PMOS transistors 401, 403, 405, and 407 conduct, a "crow bar" (direct connection) condition is generated which in turn reduces noise in the signal at output terminal 213C of driver circuit 413 (see FIG. 4). As can be seen in FIG. 5D, the rising edges of signals pu1, pu2, pu3, and pu4 transition simultaneously at time t1 while the rising edges of signals pd1, pd2, pd3, and pd4 transition sequentially at times t2, t3, t4 and t5. At the falling edges, signals pd1, pd2, pd3, and pd4, transition simultaneously at time t5 while signals pu1; pu2, pu3, and pu4, transition sequentially at times t6, t7, t8 and t9. (Terminal 537 is the recipient of the DriveSel' signal of block 202 of FIG. 2A).

Figure 6A:
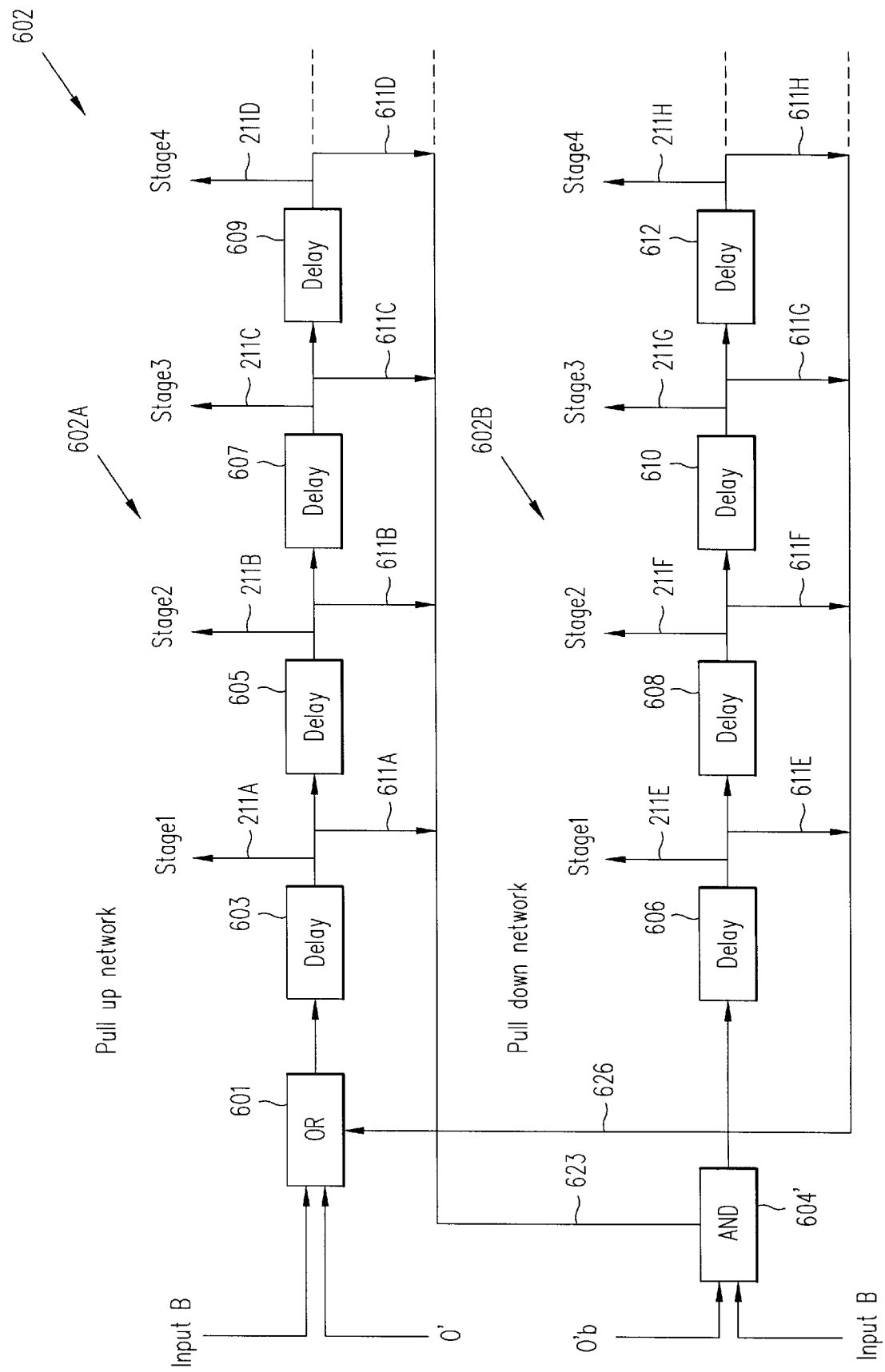
FIG. 6A shows a block diagram of a second embodiment of a sequencer for sequencing an arbitrary number of stages.

FIG. 6A shows a block diagram of another sequencer 602 for sequencing an arbitrary number of driver 413 stages. Pull-up network 602A of sequencer 602 includes ORGATE 601 and delays 603, 605, 607, and 609. Pull-down network 602B of sequencer 602 includes ANDGATE 604 and delays 606, 606, 610, and 612. Delay elements 603 through 612 can be standard RC delay elements.

As can be seen in FIG. 6A, the signals on buses 611A–611D of pull-up network 602A, which are the same signals present on buses 211A–211D, respectively, are coupled to bus 623 and ANDGATE 604 of pull-down network 602B. Similarly, the signals on buses 611E–611H, which are the same signals present on buses 211E–211H, respectively, of pull-down network 602B are coupled to bus 626 and ORGATE 601 of pull-up network 602A.

The configuration of sequencer 602 shown in FIG. 6A provides that if any one of the signals on buses 611E–611H, i.e., signals pd1–pd4, of pull-down network 602B, are high then an input signal to ORGATE 601 of pull-up network 602A is also high. Similarly, when any of the signals on buses 611A–611D, i.e., signals pu1–pu4, of pull-up network 602A are high then a high signal is coupled to ANDGATE 604 of pull-down network 602B. Consequently, the output signals of pull-down network 602B cannot go high as long as any of the output signals of pull-up network 602A are low. Similarly, the output signals of pull-up network 602A cannot go low as long as any of the outputs of pull-down network 602B is high. This configuration prevents sequencer 602 from causing any of the pull-up transistors 401, 403, 405, or 407 (see FIG. 4) to conduct at the same time as any of the and pull-down transistors 402, 404, 406, or 408. Consequently, the power supply cannot be shorted to ground.

Figures 1, 6B:
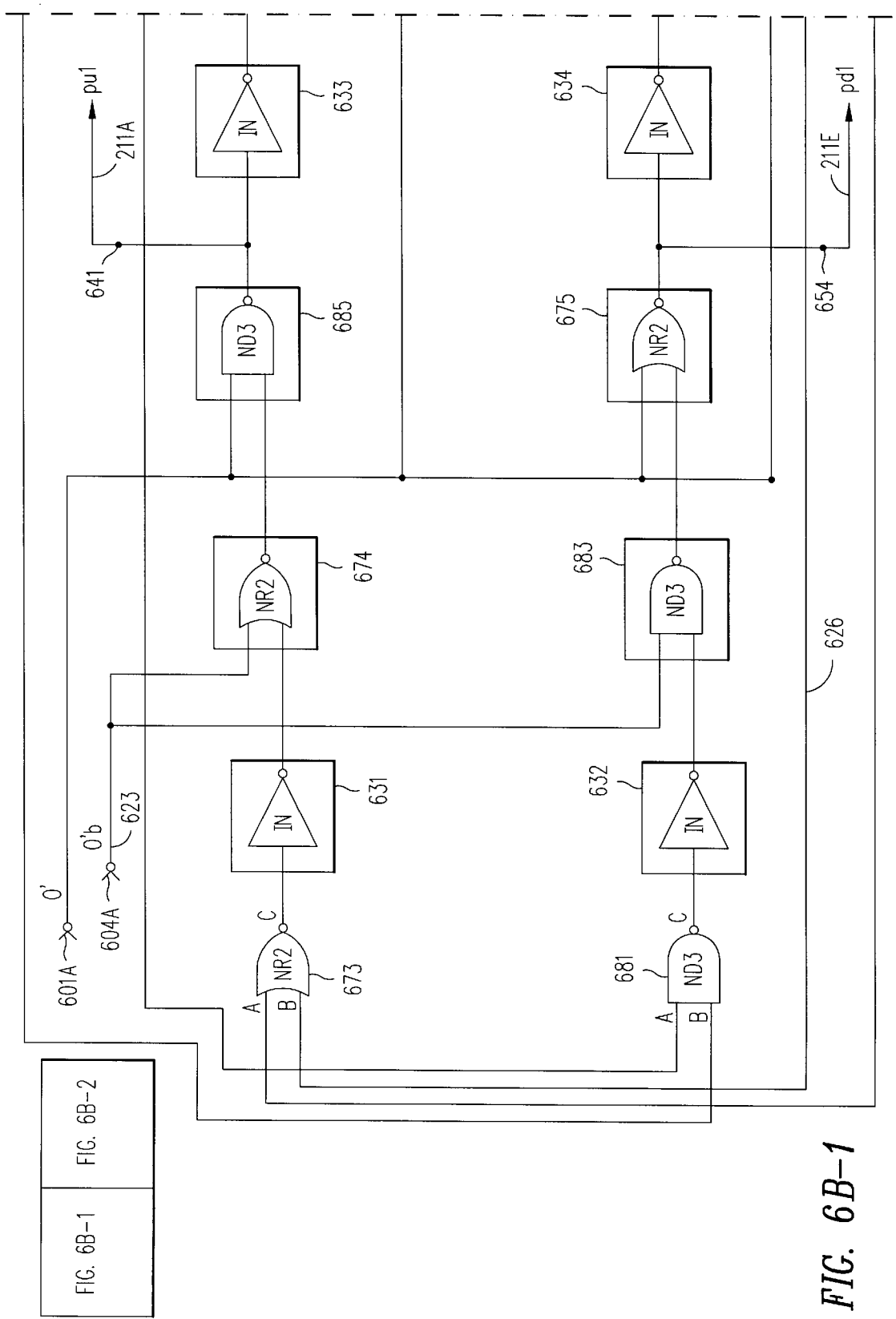
FIG. 6B shows a gate level schematic of the second embodiment of a sequencer shown in FIG. 6A.
Figures 2, 6B:
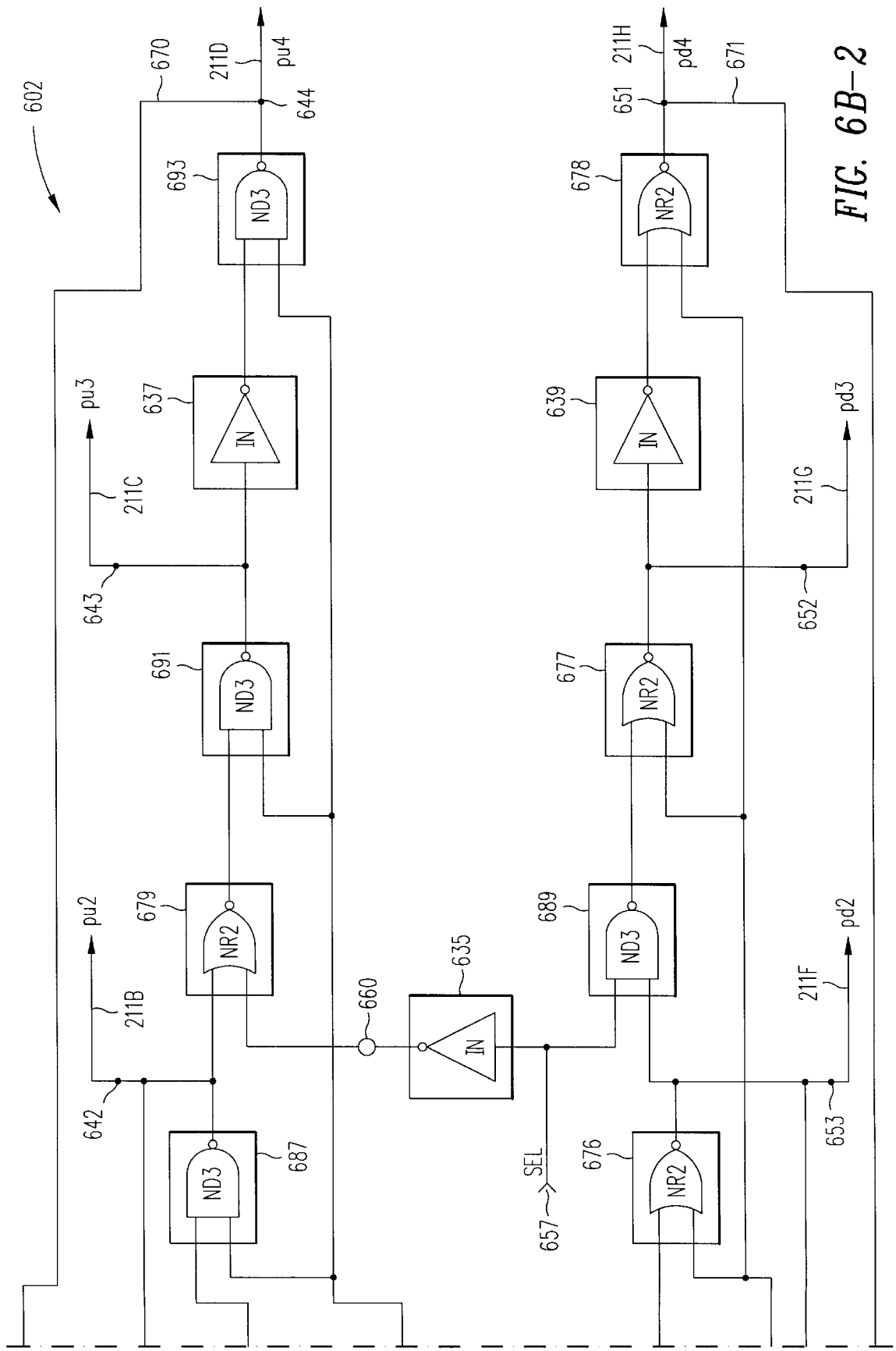

FIG. 6B shows a gate level schematic of one embodiment of a sequencer 602. In FIG. 6B, sequencer 602 includes an O' input terminal 601A, an O'b input terminal 604A, and a DriveSel' input terminal 657 with signal DriveSel'b being generated at node 660 by inverter 635.

Sequencer 602 in FIG. 6B includes output terminals 641–644 for pull-up signals pu1–pu4 which are coupled to buses 211A–211D (see FIG. 4) and output terminals 651–654 for pull-down signals pd1–pd4 which are coupled to lines 211E–211H. As with sequencer 502A shown in FIG. 5A, sequencer 602 includes several well known logic elements including: NORGATES 673, 674, 675, 676, 677, 678 and 679, NANDGATES 681, 683, 685, 687, 689, 691 and 693, and inverters 631, 632, 633, 634, 635, 637 and 639. In addition, sequencer 602 includes feed back signals 623, 670, 626, 671, this ensures that as long as pu4(644 or 670) is low, none of the pd1 pd2 pd3 pd4 signals go high, and that as long as any of the pu1 pu2 pu3 pu4 signals are high, none of the pd1 pd2 pd3 pd4 go low, thus preventing a short between power and ground under any condition.

Figure 6C:
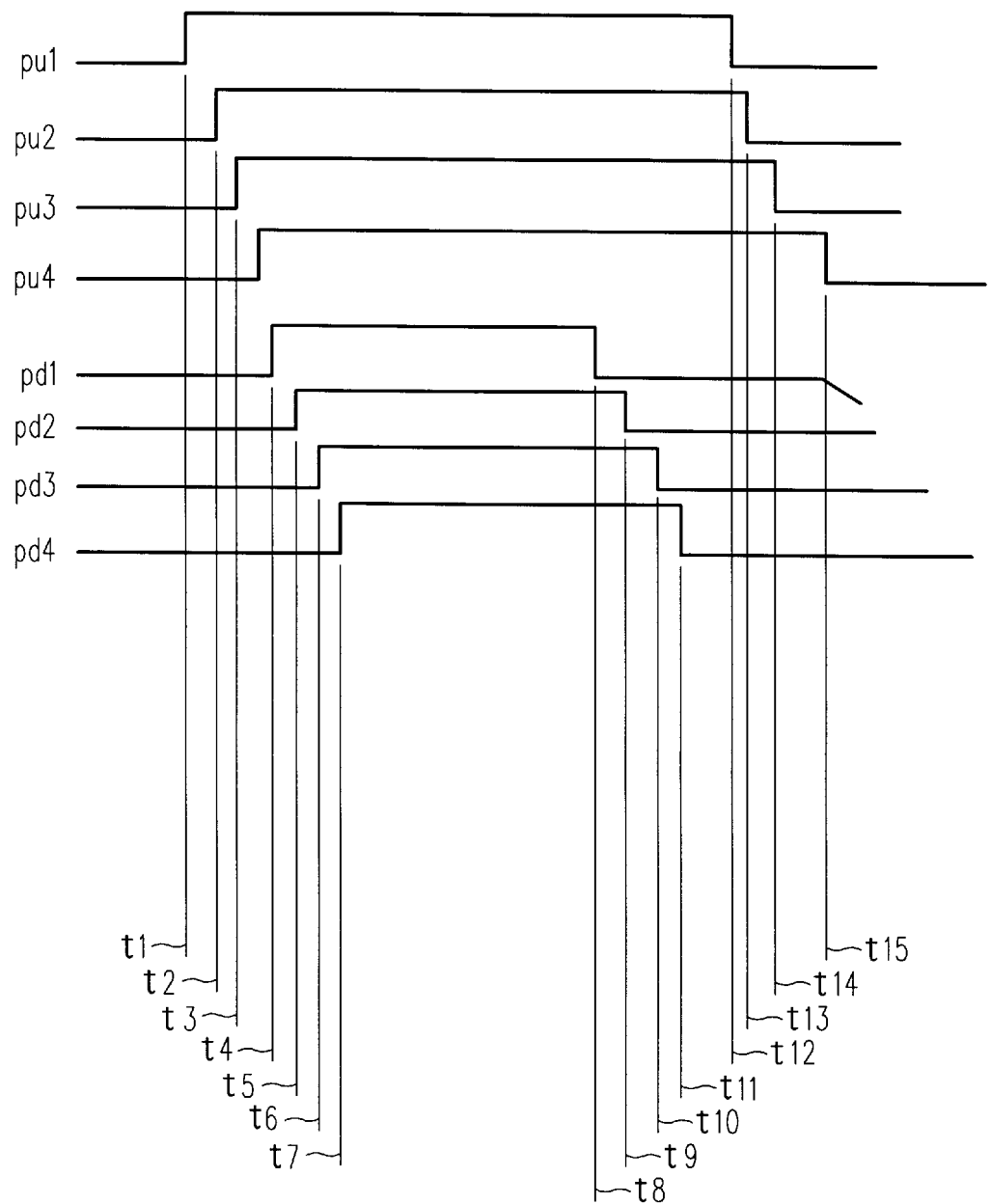
FIG. 6C is a signal diagram for the sequencer shown in FIG. 6B.

FIG. 6C is a signal timing diagram for sequencer 602 of FIG. 6B. At the rising edge, signals pu1, pu2, pu3, and pu4 and signals pd1, pd2, pd3, and pd4 transition sequentially at times t1–t7. The falling edges of signals pd1, pd2, pd3 and pd4 and pu1, pu2, pu3 and pu4 also transition sequentially at times t8–t15.

The tradeoff between sequencer 502A and sequencer 602 shown in FIGS. 5A, 5B, 5C and 6A, 6B, 6C is the propagation delay time and the noise introduced into the system.

While the examples of sequencer 202 and driver 213 (see FIGS. 2A and 2B) shown in FIGS. 4, 5A, 5B, 5C, 6A, 6B, and 6C all include four pull-up and four pull-down stages, i.e. four pull-up transistors 401, 403, 405 and 407 and four pull-down transistors 402, 404, 406 and 408, other embodiments can include any number of pull-up or pull-down stages desired.

In addition to the full/partial feedback sequencers 502A and 602 discussed above, other sequence control schemes can be implemented using a modified sequencer 202 (see FIG. 2A). For instance, sequencer 202 can be used to operate buffer 105 (see FIGS. 1 and 2A) in an "optimal drive select mode". Optimal drive select allows buffer 105 to choose different buffering levels by activating only selected ones of signals pu1–pu4 and pd1–pd4. In this way the noise introduced into the data signal is kept to a minimum. Thus, in optimal drive mode, the amplification stage ratio of each driver transistor 402–409 (see FIG. 4) is set to keep the operation of the buffer as a whole at a point that is as close as possible to the noise vs. speed characteristic curve of an ideal buffer. It was found that when the total size of transistors needed is distributed in a ratio of 20%/10%/20%/50% for respectively the transistors 402, 404, 406, 408, then the circuit achieves an optimum operating point on the speed/noise curve for a PCI driver.

FIGS. 7A, 7B and 7C, 7D show two configurations of sequencer 702A and 702B, respectively, where the amplification stages are activated and deactivated by routing the input signal through a pass gate which is selectively turned on and off.

Figure 7A:
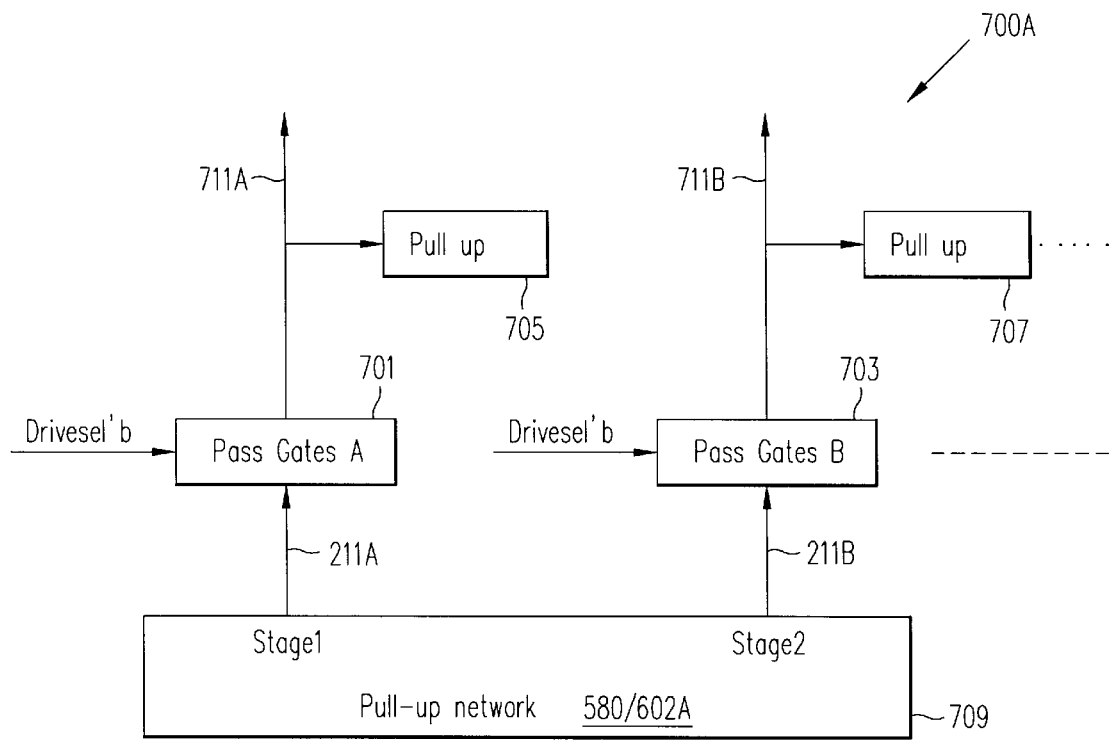
FIGS. 7A, 7B show a first embodiment of a sequencer configured to be operated in an optimal drive select mode.
Figure 7B:
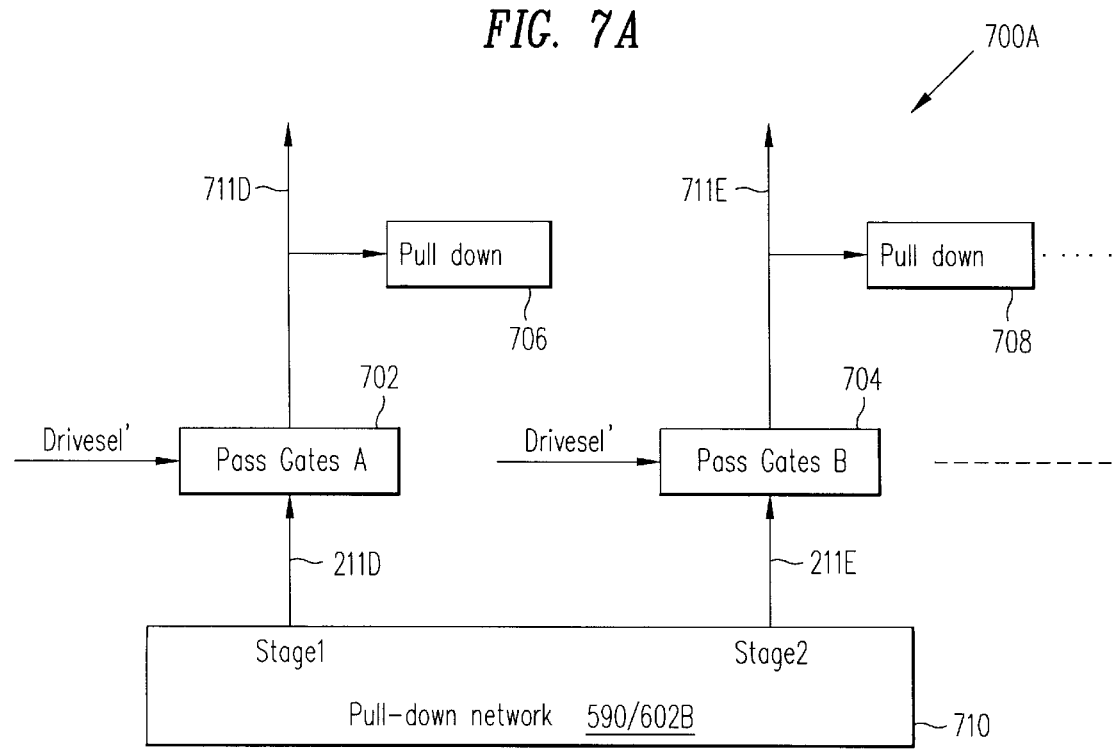

FIGS. 7A and 7B show a block diagram for respectively the pull-up and down portions of stage selector 700A which utilizes pass gates 701, 703, 702 and 704 to effect an optimal drive select mode of operation and which ties to the circuit of FIG. 2B. As shown in FIG. 7A, a pull-up network such as pull-up network 580 (see FIG. 5A) or pull-up network 602A (see FIG. 6A) is connected to busses 211A and 211B (see FIG. 4). In addition, selector 700A (see FIG. 7B) includes pull-down network 710 such as pull-down network 590 (see FIG. 5A) or pull-down network 602B (see FIG. 6A) connected to output buses 211D and 211E. In contrast to sequencer 502A and 602 (see FIGS. 5A and 6A) the signals on buses 211A, 211B, 211D and 211E of sequencer 700A are not coupled directly to driver 413 (see FIG. 4) but are instead coupled to pass gates 701, 703, 702, and 704, respectively. Pass gates 701–704 are activated or "turned on" by signals DriveSel'b (pull-up network 709) and signal DriveSel' (pull-down network 710). Pass gates 701, 703, 702, and 704, are configured such that when signal DriveSel'b is high, pass gate 701 and 703 allow the signal on buses 211A and 211B, respectively, to pass through to buses 711A and 711B respectively and pull-up devices 705 and 707, respectively. Consequently, when the signal DriveSel'b is high, pull-up signals pu1–pu4 pass through to driver 413 (see FIG. 4).

On the other hand, when signal DriveSel'b is high, signal DriveSel' is low. When signal DriveSel' is low, pass gates 702 and 704 do not allow the signals on buses 211D and 211E to pass and these signals are prevented from being coupled to driver 413. However, when signal DriveSel' is high, the signals on buses 211D and 211E are coupled to buses 711D and 711E, respectively, and pull-down devices 706 and 708, respectively.

In addition, when signal DriveSel' is high, signal DriveSel'b is low and the signals on buses 211A and 211B are prevented from being coupled to driver 413 (see FIG. 4).

Pull-down devices 705, 707, 706 and 708 and pass gates 701, 703, 702 and 704 can be of components well known to those skilled in the art such as a transistor or a more complex logic gate.

Figure 7C:
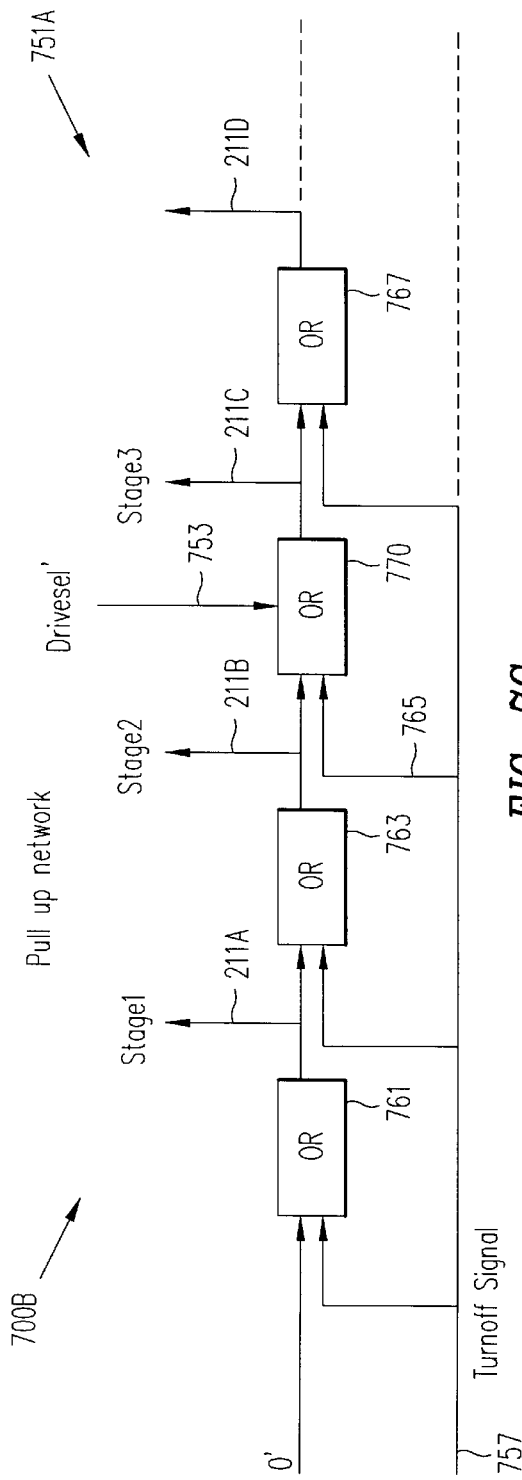
FIGS. 7C, 7D show a second embodiment of a sequencer configured to operate in an optimal drive select mode.
Figure 7D:
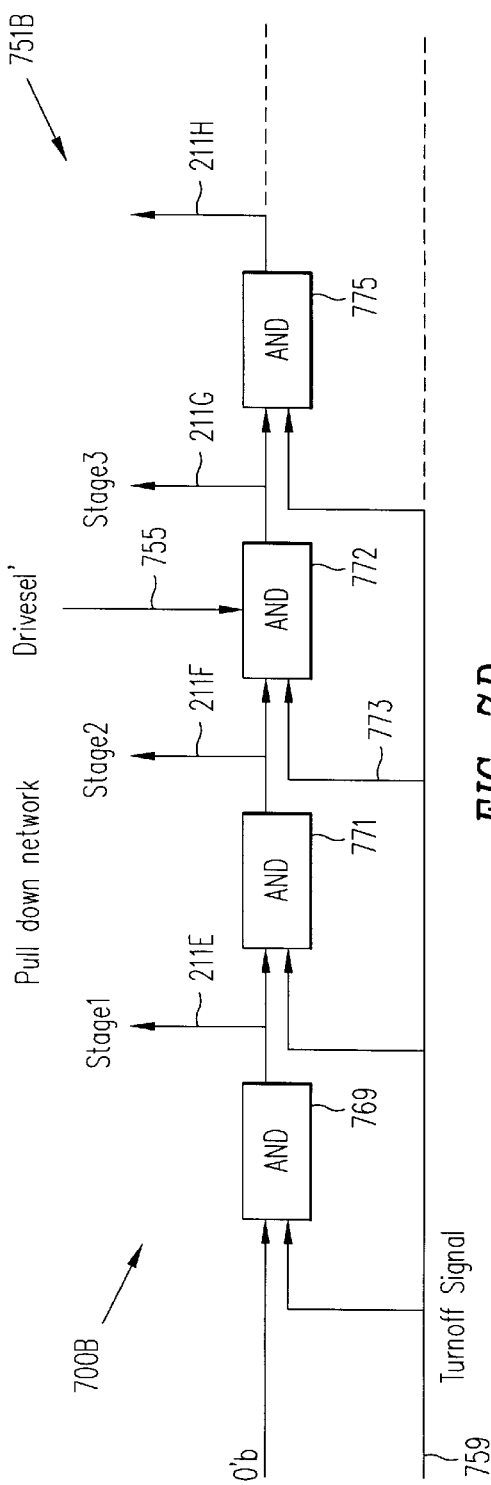

FIGS. 7C, 7D shows respectively the pull-up and pull-down portions of a sequencer 700B similar to sequencer 502A and 602 (see FIGS. 5A and 6A) and which includes pull-up networks 751A and pull-down networks 751B. Sequencer 700B includes line 753 and line 755 coupled to pull-up network 751A and pull-down network 751B, respectively. According to the sequencer of FIGS. 7C, 7D when signal DriveSel' changes state, sequencer 700B selectively cuts off all stages subsequent to the stage which is coupled to bus 753 or 755. For instance, in FIG. 7C, when signal DriveSel' is high, the output of ORGATE 770 remains high while the output of ANDGATE 772 (FIG. 7D) goes low. Consequently, all pull-down stages subsequent to ANDGATE 772 are turned off. Of course, those of skill in the art will recognize that other configurations of a sequencer capable of implementing an optimal drive select mode are possible using other combinations of inputs and gates.

Figure 8A:
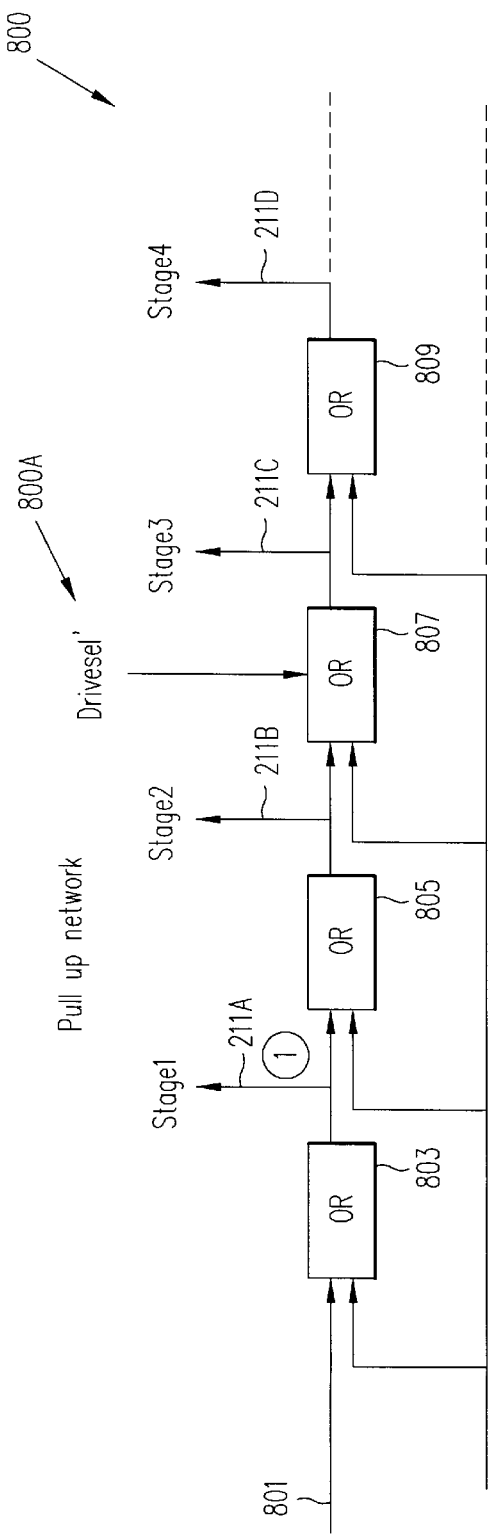
FIGS. 8A, 8B show one embodiment of a sequencer which is configured for the controlled introduction of crow bar current in accordance with the invention.
Figure 8B:
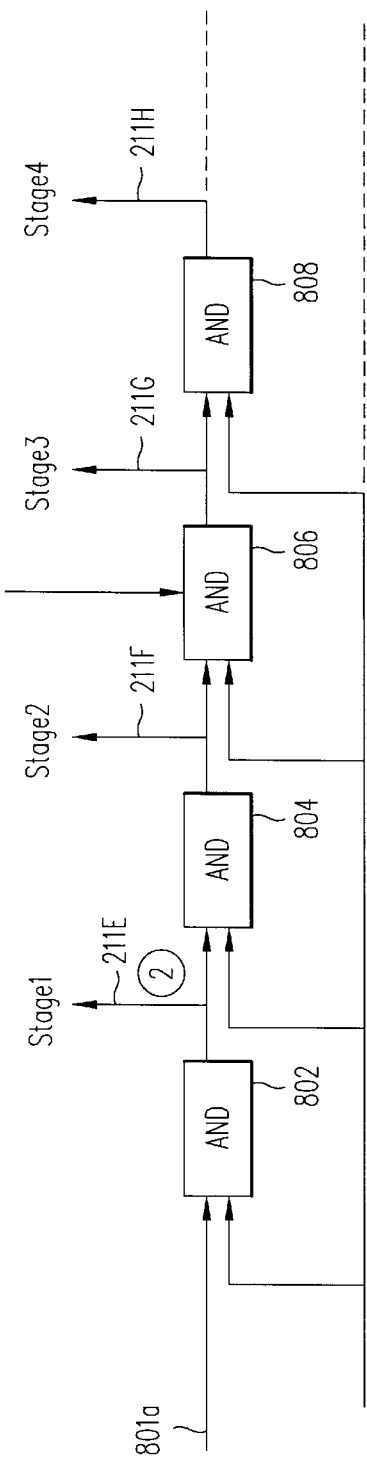

In addition to the full/partial feedback sequencer 502A and 602 and the optimal drive select mode sequencer 700A and 700B discussed above, sequencer 202 (see FIG. 2A) can be used to introduce a controlled amount of crowbar current for noise reduction. It has been determined that when a small amount of crowbar current is present, i.e., when both pull-up transistors 401, 403, 405 and 407 and pull-down transistors 402, 404, 406 and 408 are conducting (on) for a very brief period of time, this condition tends to reduce the noise that the buffer generates. Sequencer 202 can be configured to introduce this feature to take advantage of the improved noise reduction. FIGS. 8A, 8B show respectively the pull-up and pull-down portions of one embodiment of a sequencer 800 which allows for the controlled introduction of crowbar current. In a general implementation, signals 801 and 801a are compliments of each other, i.e., 180° out of phase. Sequencer 800 allows for a controlled amount of crowbar current at the first stage only. This is accomplished by controlling the delay between signals 801 and 801a and designing logic gates at nodes 1 and 2 that allow pull-up transistors 401, 403, 405 and 407 and pull-down transistors 402, 404, 406 and 408 to conduct at the same time.

In addition to the features of the present invention discussed above, the slew rate of the output wave form at pad 118 (see FIG. 2A) can controlled by controlling the delay between the pull-up signals pu1–pu4 and pull-down signals pd1–pd4 and controlling the stage ratios as discussed above.

Those of skill in the art will recognize that any of the embodiments of sequencer 202 (see FIG. 2A) shown in FIGS. 5A, 5B, 5C and 6A, 6B, 6C can be implemented using various combinations of OR gates, OR-NOT gates, AND gates, AND NOT gates, EXCLUSIVE NOR gates, NAND-ONLY gates, or any of the other well known combinations of logic elements that can have any arbitrary number of multiple inputs as needed. Further, the delays 603 through 612 in FIG. 6A can be implemented in e.g. diffusion resistor/capacitor, poly resistor/capacitor, NOT-GATE, NANDGATE, NORGATE, or any combination of the above.

Although the present invention has been described with reference to particular embodiments, the description is only an example of the invention's application and should not be taken as a limitation. In particular, even though much of preceding discussion was aimed at four alternative embodiments of this invention, various other adaptations and combinations of features of the embodiments disclosed are within the scope of the present invention as defined by the appended claims.

I claim:

1. An input/output buffer comprising:

a translator circuit for translating voltage levels and including a first input terminal for receiving a signal from logic circuitry, second and third power terminals coupled to a first power supply, third and fourth power terminals coupled to a second power supply supplying a voltage different from that of said first power supply, a plurality of output terminals coupled to a plurality of output lines, and a fifth input terminal for receiving an enable signal, wherein an active signal is present on said fifth input terminal of said translator circuit, said translator circuit translates said signal on said first input terminal from a voltage of said first power supply to a voltage of said second power supply;

a sequencing circuit including a plurality of input terminals coupled to said plurality of output terminals of said translator circuit, said sequencing circuit having first and second power terminals coupled to said second power supply, and having a first plurality of output terminals coupled to a first plurality of output lines and a second plurality of output terminals coupled to a second plurality of output lines, said first plurality of output lines carrying pull-up signals and said second plurality of output lines carrying pull-down signals;

a driver circuit for driving signals and having first and second power terminals coupled to said second power supply, said driver circuit having a first plurality of input terminals coupled to said first plurality of output terminals of said sequencer circuit and a second plurality of output terminals of said sequencer circuit, and having a first output terminal;

an input/output pad coupled to said first output terminal of said driver circuit and being connectable to an external system, said external system being coupled to said second power supply;

a precondition logic circuit having first and second power terminals coupled to said second power supply, said precondition logic circuit having a third input terminal coupled to said input/output pad, and having an output terminal;

a TTL detector circuit for detecting voltage levels and having a first input terminal coupled to said output terminal of said precondition logic circuit, and having a second power terminal coupled to said first power supply and a third power terminal coupled to said second power supply, said TTL detector circuit having an output terminal;

a second translator circuit for translating voltage levels and having a first input terminal coupled to said output terminal of said TTL detector circuit, and having second and third power terminals coupled to said first power supply, and fourth and fifth power terminals coupled to said second power supply, said translator circuit including an output terminal; and an output terminal of said input/output buffer, said output terminal being coupled to said output terminal of said translator circuit, wherein said output terminal is coupled to said logic circuitry.

2. The input/output buffer of claim 1, wherein said input/output buffer includes all digital components.

3. The input/output buffer of claim 1, wherein said translator circuit includes only a plurality of transistors and connections therebetween.

4. The input/output buffer of claim 1, wherein said sequencing circuit includes only a plurality of series-connected logic gates and connections therebetween.

5. The input/output buffer of claim 1, wherein said driver circuit includes only a plurality of transistors and connections therebetween.

* * * * *

UNITED STATES PATENT AND TRADEMARK OFFICE
CERTIFICATE OF CORRECTION

PATENT NO. : 5,862,390
DATED : January 19, 1999
INVENTOR(S) : Ranjan, Nalini

It is certified that error appears in the above-identified patent and that said Letters Patent is hereby corrected as shown below:

<u>Column 13,</u>
Line 65, add the word "be" after "can" and before "controlled".

Signed and Sealed this

Thirtieth Day of October, 2001

*Attest:*

NICHOLAS P. GODICI
*Attesting Officer*     *Acting Director of the United States Patent and Trademark Office*